(12) United States Patent
Sato et al.

(10) Patent No.: US 9,285,465 B2
(45) Date of Patent: Mar. 15, 2016

(54) ANALOG-DIGITAL CONVERSION CIRCUIT, SENSOR APPARATUS, CELLULAR PHONE, AND DIGITAL CAMERA

(71) Applicant: SHARP KABUSHIKI KAISHA, Osaka-shi, Osaka (JP)

(72) Inventors: Hideki Sato, Osaka (JP); Takahiro Inoue, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/418,398

(22) PCT Filed: Jun. 10, 2013

(86) PCT No.: PCT/JP2013/065983
§ 371 (c)(1),
(2) Date: Jan. 29, 2015

(87) PCT Pub. No.: WO2014/041858
PCT Pub. Date: Mar. 20, 2014

(65) Prior Publication Data
US 2015/0192664 A1 Jul. 9, 2015

(30) Foreign Application Priority Data

Sep. 14, 2012 (JP) .................................. 2012-203623

(51) Int. Cl.
| | |
|---|---|
| H03M 1/18 | (2006.01) |
| G01S 7/486 | (2006.01) |
| H03M 1/06 | (2006.01) |
| G01J 1/44 | (2006.01) |
| G01S 17/10 | (2006.01) |
| H03M 1/36 | (2006.01) |
| H03M 1/12 | (2006.01) |

(52) U.S. Cl.
CPC ................. *G01S 7/4861* (2013.01); *G01J 1/44* (2013.01); *G01S 17/10* (2013.01); *H03M 1/0607* (2013.01); *H03M 1/181* (2013.01); *H03M 1/368* (2013.01); *H03M 1/12* (2013.01)

(58) Field of Classification Search
CPC ..... H03M 1/181; H03M 1/403; H03M 1/442; G01S 7/4861; G01S 17/10
USPC .......... 250/214 R, 214 DC, 214 SW, 214 LS; 341/155, 161, 172
See application file for complete search history.

(56) References Cited

U.S. PATENT DOCUMENTS

| | | | | |
|---|---|---|---|---|
| 5,748,134 A | * | 5/1998 | Dent ...................... | H03M 1/54 341/164 |
| 7,554,480 B2 | * | 6/2009 | Nakata .................... | H03M 1/14 341/155 |
| 2008/0012741 A1 | | 1/2008 | Nakata et al. | |

FOREIGN PATENT DOCUMENTS

| | | |
|---|---|---|
| JP | 9-269259 A | 10/1997 |
| JP | 2001-160756 A | 6/2001 |
| JP | 2008-42886 A | 2/2008 |

* cited by examiner

*Primary Examiner* — Kevin Pyo
(74) *Attorney, Agent, or Firm* — Birch, Stewart, Kolasch & Birch, LLP

(57) ABSTRACT

An analog-digital conversion circuit (ADC1) includes: a capacitor (C1); a charge and discharge control section (6) that puts, into the capacitor (C1), an electric charge corresponding to an input current of a first period and that causes an electric charge corresponding to an input current of a second period to be discharged from the capacitor (C1); and a digital conversion section (5) that converts an amount of electric charge of the capacitor (C1) into a digital signal.

16 Claims, 21 Drawing Sheets

F I G. 14
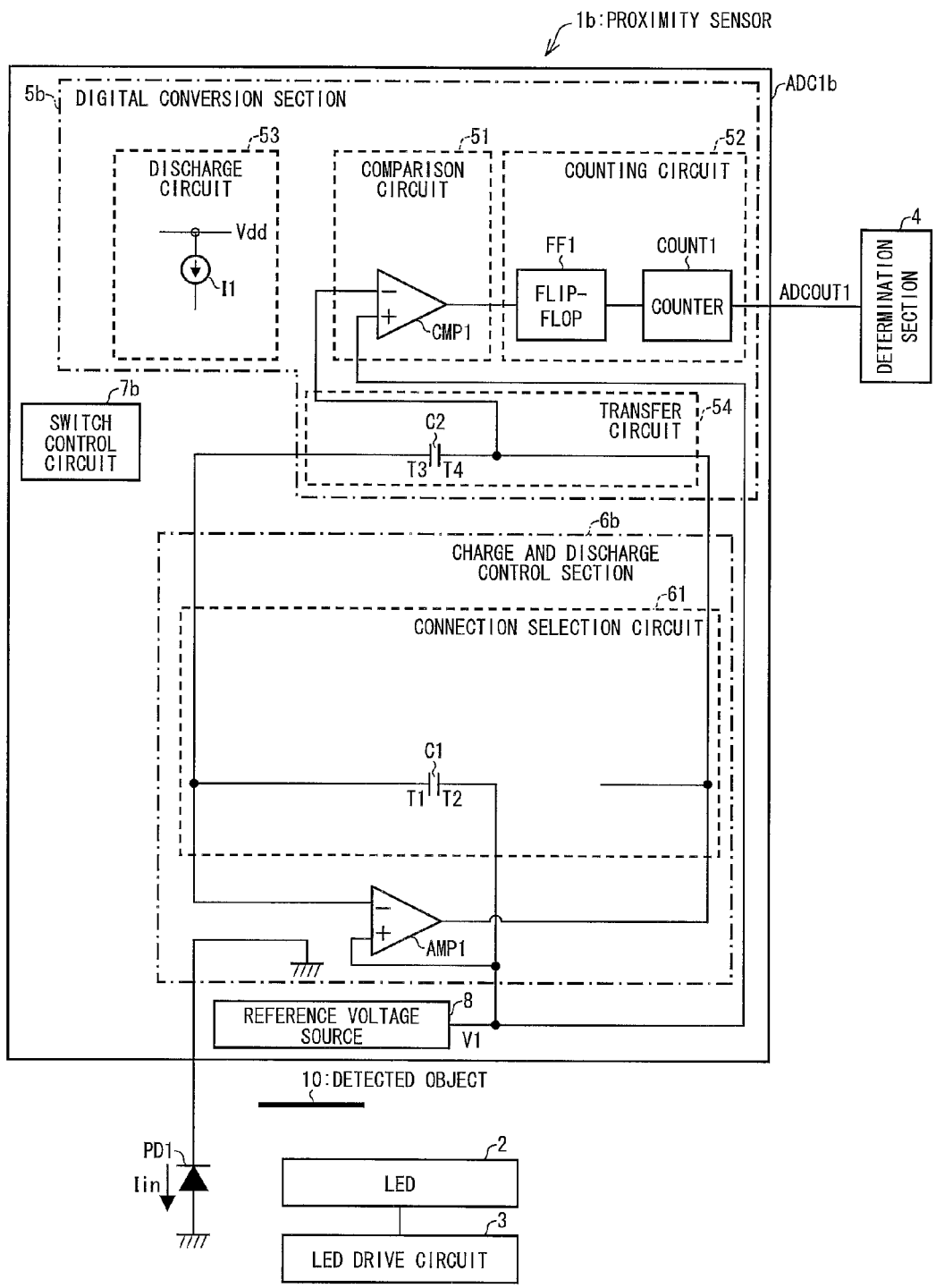

--CONVENTIONAL ART--

FIG. 17 —CONVENTIONAL ART—

--CONVENTIONAL ART--

--CONVENTIONAL ART--

--CONVENTIONAL ART--

ANALOG-DIGITAL CONVERSION CIRCUIT, SENSOR APPARATUS, CELLULAR PHONE, AND DIGITAL CAMERA

TECHNICAL FIELD

The present invention relates to an analog-digital conversion circuit and a sensor device, such as a proximity sensor, a range sensor, or a motion sensor, in which the analog-digital conversion circuit is used.

BACKGROUND ART

In the field of cellular phones, digital cameras, etc. having liquid crystal panels, there is, for the purpose of reducing power consumption and preventing a malfunction of a touch panel, a growing demand for mounting of a proximity sensor that causes the liquid crystal panel and the touch panel to be turned off when a face comes close to the liquid crystal panel. Since the output value of a proximate sensor is inversely proportional to the distance detected, there is also a demand for use of a proximity sensor as a range sensor. Further, there is also a demand for use of a proximity sensor as a motion sensor to detect a motion of a hand or the like from changes over time in the respective output values of a plurality of photodiodes disposed in the proximity sensor.

A cellular phone, a digital camera, or the like mounted with such a sensor is often used outdoors, and the sensor is required to operate properly even in a case where a highly intense disturbance DC light component such as sunlight is incident on the sensor. A circuit configuration that satisfies this requirement is described here.

A general method of sensor detection is a method in which a sensor output is converted into a digital value by an analog-digital conversion circuit. In recent years, as a proximity sensor, a system has been employed which includes an integral-mode analog-digital conversion circuit and a drive circuit of a light-emitting diode (LED).

As a conventional technology concerning an analog-digital conversion circuit, a system described in a Patent Literature 1 is proposed.

FIG. 16 is a circuit diagram showing a configuration of an analog-digital conversion circuit 100 described in Patent Literature 1. The analog-digital conversion circuit 100 includes: a voltage follower 101, which performs impedance conversion of a measured voltage Vin; a capacitor 102, which is charged by an output voltage from the voltage follower 101; a negative power supply 103; a constant current circuit 104, which discharges, into the negative power supply 103, an electric charge put into the capacitor 102; a comparator 105, which receives a terminal voltage of the capacitor 102 as an input voltage; a clock circuit 106, which outputs clock pulses; a counter 107, which counts the clock pulses; a charge switch 108; a discharge switch 109; and a control circuit 110, which controls opening and closing of the charge switch 108 and the discharge switch 109. This enables the analog-digital conversion circuit 100 to perform analog-digital conversion of an input voltage value with a simple configuration.

Further, as a conventional technology concerning an illuminance sensor in which an analog-digital conversion circuit is used, a system described in a Patent Literature 2 is proposed.

FIG. 17 is a circuit diagram showing a configuration of an illuminance sensor 200 described in Patent Literature 2. The illuminance sensor 200 includes: a photodiode PD, which converts light serving as an object to be measured into an electric current; and an analog-digital conversion circuit (a charge and discharge section 210 and a control computation section 220), which receives an output from the photodiode PD as an input current. The illuminance sensor 200 is configured to perform digital output according to illuminance. The charge and discharge section 210 includes a charge circuit 211, a first discharge circuit 212, a second discharge circuit 213, and a comparison circuit 214.

The charge circuit 211 is means by which an electric charge corresponding to an input current (a detection current of the photodiode PD) is stored during a predetermined charge period. The charge circuit 211 includes: an operational amplifier AMP; a charging capacitor C201, one end of which is connected to an inverting input terminal (−) of the operational amplifier AMP201 and the other end of which is connected to an output terminal of the operational amplifier AMP201; a first constant voltage source E201, which applies a predetermined first reference voltage V201 to a non-inverting input terminal (+) of the operational amplifier AMP201; a first switch SW201, which opens or closes between an input terminal via which the input current is inputted (i.e. an anode of the photodiode PD) and the one end of the charging capacitor C201 in accordance with a control signal S201; and a second switch SW202, which short-circuits between the two ends of the charging capacitor C201 in accordance with a control signal S202.

The first discharge circuit 212 is means by which an electric charge stored in the charge circuit 211 is discharged every time the amount of electric charge in the charge circuit 211 reaches a predetermined threshold value during the charge period. The first discharge circuit 212 includes: a first discharging capacitor C202 (1/m (m>1) of the charging capacitor C201); third switches SW203a and SW203b, which open or close between one end of the first discharging capacitor C202 and a ground terminal and between the other end of the first discharging capacitor C202 and the inverting input terminal (−) of the operational amplifier AMP201, respectively, in accordance with a control signal S203; and fourth switches SW204a and SW204b, which open or close between the two ends of the first discharging capacitor C202 and a terminal via which the first reference voltage V201 is applied, respectively, in accordance with a control signal S204.

The second discharge circuit 213 is means by which after expiration of the charge period, an electric charge remaining in the charge circuit 211 is discharged stepwise by a predetermined amount with a lower discharge capacity than that of the first discharge circuit 212 until the residual charge takes on a predetermined value. The second discharge circuit 213 includes: a second discharging capacitor C203 (1/n (n>m) of the charging capacitor C201); a second constant voltage source E202, which generates a second reference voltage V202 (1/k (k>1) of the first reference voltage V201); fifth switches SW205a and SW205b, which open or close between one end of the second discharging capacitor C203 and a positive terminal of the second constant voltage source E202 and between the other end of the second discharging capacitor C203 and the inverting input terminal (−) of the operational amplifier AMP201, respectively, in accordance with a control signal S205; and sixth switches SW206a and SW206b, which open or close between the two ends of the second discharging capacitor C203 and a terminal via which the first reference voltage Vref is applied, respectively, in accordance with a control signal S206.

The comparison circuit 214 is means by which an output voltage Va from the operational amplifier AMP201 is compared with a third reference voltage V203 (Vref) and a fourth reference voltage V204 (Vref/2). The comparison circuit 214 includes: a third constant voltage source E203, which generates a third reference voltage V203; a fourth constant voltage source E204, which generates a fourth reference voltage V204; a first comparator CMP201, a non-inverting input terminal (+) of which is connected to the output terminal of the operational amplifier AMP201 and an inverting input terminal (−) of which is connected to a positive terminal of the third constant voltage source E203; and a second comparator CMP202, an inverting input terminal (−) of which is connected to the output terminal of the operational amplifier AMP201 and a non-inverting input terminal (+) of which is connected to a positive terminal of the fourth constant voltage source E204.

The control computation section 220 is means by which the control signals S201 to S206 are generated in accordance with a predetermined clock signal CLK and output signals CO201 and CO202 from the respective comparison circuits CMP201 and CMP202, by which charge and discharge control of the charge circuit 211 and the discharge circuits 212 and 213 is performed, by which the total amount of electric charge in the charge circuit 211 is computed from the total number of times the discharge circuit 212 and 213 performed discharge, and by which a digital output (DOUT) corresponding to a result of the computation is produced.

In the analog-digital conversion circuit, which is constituted by the charge and discharge section 210 and the control computation section 220, the capacitor C201 is charged during the specified charge time and discharged by the first discharge circuit 212 every time the capacitor C201 takes on a predetermined amount of electric charge. Then, by causing an electric charge after the end of the charge time to be discharged by second discharge circuit 213, the analog-digital conversion circuit outputs a digital value according to the amount of electric charge in the capacitor C201 in accordance with the number of times the first discharge circuit 212 performed discharge and the duration that the second discharge circuit 213 performed discharge. This enables the configuration of Patent Literature 2 to expand an input dynamic range, improve limiting resolution, and shorten measuring time.

FIG. 18 is a diagram schematically showing a configuration of a general proximity sensor 300. The proximity sensor 300 includes a light-emitting diode (LED) 310, a photodiode 320, and a control circuit 330. The control circuit 330 supplies a pulse current to the light-emitting diode 310 to drive the light-emitting diode 310. In the presence of an object 400 near the proximity sensor 300, pulsed light from the light-emitting diode 310 is reflected by the object 400 and received by the photodiode 320 as indicated by solid arrows. On the other hand, in the absence of the object 400, pulsed light from the light-emitting diode 310 is not reflected by the object 400, as indicated by a dashed arrow, with the result that the pulsed light from the the light-emitting diode 310 hardly reaches the photodiode 320.

The photodiode 320 converts the pulsed light thus received into a pulse current and outputs the pulse current to the control circuit 330. The control circuit 300 determines, in accordance with the magnitude of the pulse current from the photodiode 320, whether or not the object 400 is present near the proximity sensor 300.

FIG. 19 is a diagram showing an example of a configuration of the control circuit 330 of the proximity sensor 300. The control circuit 330 includes an analog-digital conversion circuit 331, a sample-hold circuit 332, a subtraction circuit 333, and a comparison circuit 334. The analog-digital conversion circuit 331 converts the input current from the photodiode 320 into a digital value. As the analog-digital conversion circuit 331, an analog-digital conversion circuit described in Patent Literature 1 or 2 is used.

The sample-hold circuit 332 holds an output digital value Data1 of the analog-digital conversion circuit 331 during a period in which the light-emitting diode 310 is being driven. After that, when the analog-digital conversion circuit 331 stops being driven, the sample-hold circuit 332 outputs the digital value Data1 to the subtraction circuit 333.

The subtraction circuit 333 subtracts, from the digital value Data1, an output digital value Data2 of the analog-digital conversion circuit 331 during a period in which the light-emitting diode 310 is not being driven, and outputs a difference Data1−Data2 to the comparison circuit 334. The comparison circuit 334 compares the difference Data1−Data2 with a threshold value Data_th and outputs a result of the comparison.

FIG. 20 is a set of waveform charts (a) and (b) showing the respective waveforms of drive signals from the light-emitting diode 310 of the proximity sensor 300, digital signals DOUT from the analog-digital conversion circuit 331, and output signals from the comparison circuit 334, (a) showing a case where there is a detected object, (b) showing a case where there is no detected object. The difference Data1−Data2 between Data1, which is a digital signal DOUT during a period in which the light-emitting diode 310 is being driven, and Data2, which is a digital signal DOUT during a period in which the light-emitting diode 310 is not being driven, serves as proximity information. The comparison circuit 334 determines whether or not any object is proximate by comparing the difference Data1−Data2 with the digital threshold value Data_th.

In the case where there is a detected object (e.g. the object 400 shown in FIG. 18), light reflected from the detected object causes the photodiode 320 to generate a larger current, with the result that the difference Data1−Data2 exceeds the digital threshold value Data_th as shown in (a) of FIG. 20. Accordingly, the comparison circuit 334 determines that the detected object is proximate. In the case where there is no detected object, there is no light reflected from any object, with the result that the difference Data1−Data2 falls short of the digital threshold value Data_th as shown in (b) of FIG. 20. Accordingly, the comparison circuit 334 determines that no object is proximate.

Further, the output value of the analog-digital conversion circuit 331 is inversely proportional to the square of the distance between a detected object and the proximity sensor 300, it is possible to apply the proximity sensor 300 as a range sensor.

FIG. 21 is a set of waveform charts (a) and (b) showing the respective waveforms of drive signals from the light-emitting diode 310 of the proximity sensor 300, digital signals DOUT from the analog-digital conversion circuit 331, and output signals from the comparison circuit 334 in the case of the proximity sensor 300 operating as a range sensor, (a) showing a case where there is an object detected at a short distance, (b) showing a case where there is an object detected at a long distance. The longer the distance between the proximity sensor 300 and a detected object is, the smaller the difference Data1−Data2 is. This makes it possible to determine whether the detected object is at a short or long distance.

CITATION LIST

Patent Literature 1
Japanese Patent Application Publication, Tokukai, No. 2001-160756 A (Publication Date: Jun. 12, 2001)

Patent Literature 2

Japanese Patent Application Publication, Tokukai, No. 2008-42886 A (Publication Date: Feb. 21, 2008)

SUMMARY OF INVENTION

Technical Problem

In a case where an analog-digital conversion circuit including a counter is used as the analog-digital conversion circuit 331 of the proximity sensor 300, the following problem arises: Specifically, in a state where a very highly intense disturbance DC light component such as sunlight is incident on the proximity sensor 300, the disturbance DC light component may cause an output digital signal DOUT from the analog-digital conversion circuit 331 to reach a count upper-limit value of the counter. For example, when the count upper-limit value is $2^{10}$ (with a count value ranging from 0 to 1023), the output digital value Data1 of the analog-digital conversion circuit 331 during a period in which the light-emitting diode 310 is being driven and the output digital value Data2 of the analog-digital conversion circuit 331 during a period in which the light-emitting diode 310 is not being driven both take on 1023, with the result that the difference Data1−Data2 takes on 0 regardless of whether the detected object is at a short or long distance.

For correct measurement of the difference Data1−Data2, the resolution (i.e. the amount of electric charge per count) of the counter of the analog-digital conversion circuit 331 needs to be set in accordance with the intensity of disturbance DC light. That is, if the intensity of disturbance DC light is intended to be the intensity of highly intense light such as sunlight, the resolution of the counter needs to be set low (i.e. the amount of electric charge per count needs to be set large). If so, the intensity of light reflected from the detected object in response to light from the light-emitting diode 310 is lower than the intensity of disturbance DC light. Doing so lowers the percentage of reflected light components contained in the digital values Data1 and Data2 and therefore decreases accuracy of measurement, as the intensity of light reflected from the detected object in response to light from the light-emitting diode 310 is lower than the intensity of disturbance DC light. For example, as mentioned above, when the count upper-limit value is $2^{10}$, the results may be as follows: the digital value Data1 during the time when the light-emitting diode 310 is on is 1001; the digital value Data2 during the time when the light-emitting diode 310 is off is 1000; and the difference Data1−Data2 is 1. This makes it impossible to highly accurately determine whether the detected object is at a short or long distance.

Meanwhile, making the count upper-limit value larger can make the difference Data1−Data2 larger, too, but undesirably lengthens the measuring time by an amount of time obtained by dividing the increase in the count upper-limit value by a clock frequency.

Even in a case where the invention of Patent Literature 1 is applied to the proximity sensor 300 by adding, to the control circuit 330, a circuit that converts an input current from the photodiode 320 into a voltage and an analog-digital conversion circuit described in Patent Literature 1 as an analog-digital conversion circuit for current input, the resolution (i.e. the current value of the constant current circuit 104) needs to be set in accordance with the intensity of disturbance DC light so that the output value of the analog-digital conversion circuit does not reach the count upper-limit value. This makes it impossible to highly accurately measure the difference Data1−Data2.

The configuration of Patent Literature 2 makes it possible to improve limiting resolution and shorten measuring time by regulating the respective capacitances of the first and second discharge circuits 212 and 213. However, in a case where the invention of Patent Literature 2 is applied to the proximity sensor 300, analog-digital conversion is performed by, while charging the charging capacitor C201 with an input current from the photodiode 320, discharging the charging capacitor C201 with the first discharge circuit 212 every time the charging capacitor C201 takes on a predetermined amount of electric charge and by counting the number of times the first discharge circuit 212 performed discharge within a period in which the input current is flowing. This imposes a limit to how much the period in which the input current is flowing can be shortened. That is, it is difficult to set a period in which the light-emitting diode 310 is being driven and a period in which the light-emitting diode 310 is not being driven to be a certain period of time or shorter. This presents a problem with susceptibility to a change in disturbance DC light during the measuring time.

The present invention has been made in order to solve the foregoing problems, and it is an object of the present invention to achieve an analog-digital conversion circuit capable of highly accurately converting the difference between input currents of different periods into a digital signal with a simple configuration even in a case where the input currents contain intense DC components.

Solution to Problem

In order to solve the foregoing problems, an analog-digital conversion circuit according to an aspect of the present invention includes: a first capacitor; a digital conversion section that converts an amount of electric charge stored in the first capacitor into a digital signal; and a charge and discharge control section that controls charge and discharge of the first capacitor, the charge and discharge control section putting, into the first capacitor, an electric charge corresponding to an electric current inputted to the analog-digital conversion circuit during a first period, the charge and discharge control section causing an electric charge corresponding to an electric current inputted to the analog-digital conversion circuit during a second period that follows the first period to be discharged from the first capacitor, during an analog-digital conversion period that comes after the end of the charge and discharge control carried out by the charge and discharge control section, the digital conversion section converting an amount of electric charge stored in the first capacitor at the end of the charge and discharge control into a digital signal.

Advantageous Effects of Invention

An aspect of the present invention brings about an effect of making it possible to achieve an analog-digital conversion circuit capable of highly accurately converting the difference between input currents of different periods into a digital signal with a simple configuration even in a case where the input currents contain intense DC components.

BRIEF DESCRIPTION OF DRAWINGS

FIG. 14 is a diagram showing a state of the proximity sensor shown in FIG. 10 during a charge-transfer period.

DESCRIPTION OF EMBODIMENTS

[Embodiment 1]

An analog-digital conversion circuit according to the present invention is capable of highly accurately converting the difference between input currents of different periods into a digital signal with a simple configuration even in a case where the input currents contain intense DC components. Therefore, use of the analog-digital conversion circuit according to the present invention makes it possible to achieve, with a simple configuration, a proximity sensor, a range sensor, and a motion sensor that have high detection accuracy with a simple configuration even under conditions where intense disturbance light is incident. In the present embodiment, various types of sensor device to which the analog-digital conversion circuit is applied are described with reference to FIGS. 1 and 2.

(Configuration of a Proximity Sensor as Schematically Shown)

Figure 1:
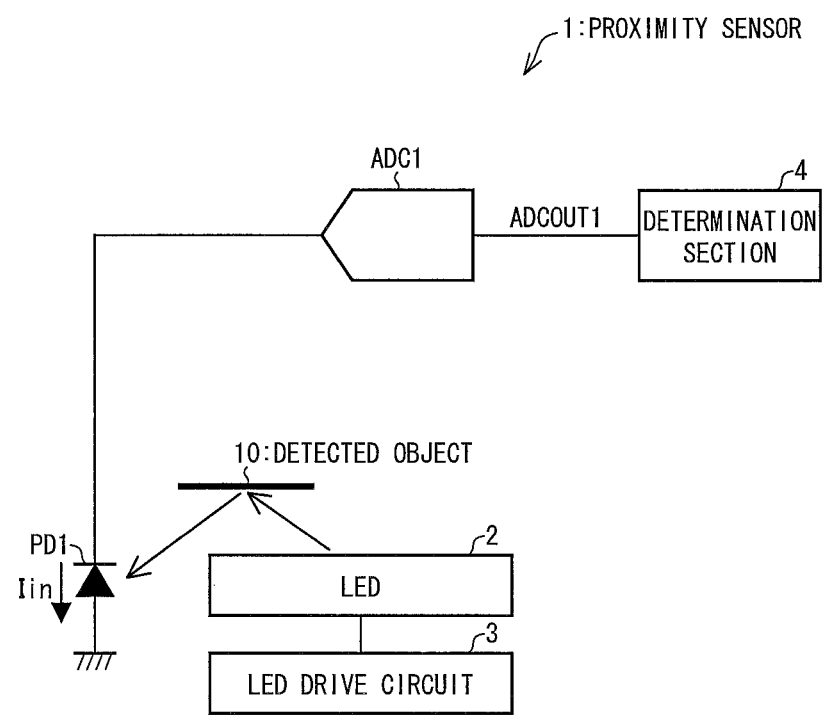
FIG. 1 is a diagram schematically showing a configuration of a proximity sensor according to an aspect of the present invention.

FIG. 1 is a diagram schematically showing a configuration of a proximity sensor 1, which is an aspect of a sensor device according to the present invention. The proximity sensor 1 is a sensor device that determines whether or not any detected object 10 is proximate. The proximity sensor 1 includes a light-emitting diode (LED, light source) 2, an LED drive circuit (light source drive circuit) 3, a photodiode PD1, an analog-digital conversion circuit ADC1, and a determination section (signal processing section) 4

The LED 2 is driven by the LED drive circuit 3, and emits light in an infrared wavelength region out of the proximity sensor 1. It should be noted that the light source used to emit light out of the proximity sensor 1 is not limited to the LED, but may be another well-known light source such as a fluorescent lamp.

The photodiode PD1 has infrared spectral characteristics, and generates an electric current according to the intensity of infrared light incident on the photodiode PD1. The analog-digital conversion circuit ADC1 is connected to a cathode of the photodiode PD1, and an electric current generated by the photodiode PD1 is inputted to the analog-digital conversion circuit ADC1.

The LED drive circuit 3 drives the LED 2 during a period t1 (first period), and stops driving the LED 2 during a period t2 (second period) that follows the period t1. Further, the analog-digital conversion circuit ADC1 converts an amount of electric charge obtained by subtracting an electric charge corresponding to an electric current inputted during the period t2 from an electric charge corresponding to an electric current inputted during the period t1 into a digital value (digital signal) ADCOUT1, and outputs the digital value ADCOUT1 to the determination section 4. That is, the digital value ADCOUT1 corresponds to the difference between the intensity of light received by the photodiode PD1 during the period t1 in which the LED 2 is on and the intensity of light received by the photodiode PD1 during the period t2 in which the LED 2 is off.

Here, in a case where the detected object 10 is proximate to the proximity sensor 1, the light intensity of light that is received by the photodiode PD1 during the period t1 is higher than the light intensity of light received by the photodiode PD1 during the period t2 by the intensity of infrared light that is emitted from the LED 2 and reflected from the detected object 10. Therefore, the digital value ADCOUT1 corresponds to the intensity of infrared light that is emitted from the LED 2 and reflected from the detected object 10. The determination section 4 compares the digital value ADCOUT1 with a predetermined threshold value Data_th and, in a case where the digital value ADCOUT1 is greater than the threshold value Data_th, determines that the detected object 10 is proximate.

In a case where the detected object 10 is not proximate to the proximity sensor 1, the intensity of the infrared light that is reflected from the detected object 10 is low; therefore, the digital value ADCOUT1 does not exceed the threshold value Data_th. Therefore, the determination section 4 determines that the detected object 10 is not proximate.

By thus including the analog-digital conversion circuit ADC1, the proximity sensor 1 can determine whether or not any detected object 10 is proximate.

Further, since the digital value ADCOUT1 is inversely proportional to the square of the distance between the proximity sensor 1 and the detected object 10, the distance between the proximity sensor 1 and the detected object 10 can be calculated on the basis of the digital value ADCOUT1. This makes it possible to apply the proximity sensor 1 as a range sensor.

(Configuration of a Motion Sensor as Schematically Shown)

Figure 2:
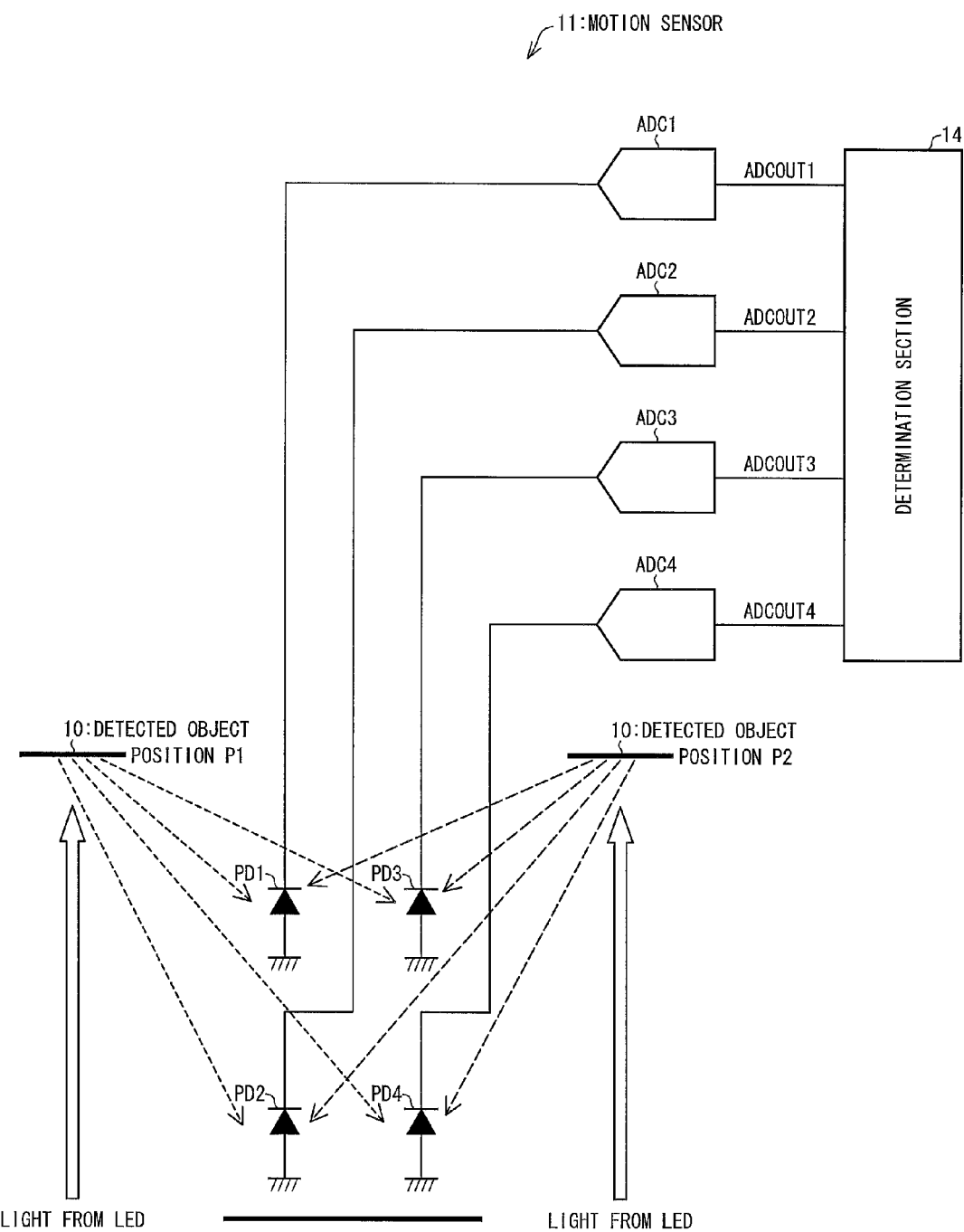
FIG. 2 is a diagram schematically showing a configuration of a motion sensor according to an aspect of the present invention.

FIG. 2 is a diagram schematically showing a configuration of a motion sensor 11, which is an aspect of a sensor device according to the present invention. The motion sensor 11 includes an LED (not illustrated), four photodiodes PD1 to PD4, four analog-digital conversion circuits ADC1 to ADC4, and a determination section 14.

Light in a wavelength region is emitted out of the motion sensor 11. Each of the photodiodes PD1 to PD4 has infrared spectral characteristics, and receives infrared light emitted from the LED and reflected from a detected object 10.

The analog-digital conversion circuits ADC1 to ADC4 are connected to cathodes of the photodiodes PD1 to PD4, respectively, and electric currents generated by the photodiodes PD1 to PD4 are inputted to the analog-digital conversion circuits ADC1 to ADC4, respectively. Each of the analog-digital conversion circuits ADC1 to ADC4 converts an amount of electric charge obtained by subtracting an electric charge corresponding to an electric current inputted during the period t2 from an electric charge corresponding to an electric current inputted during the period t1 into a digital value. The digital values that are outputted from the analog-digital conversion circuits ADC1 to ADC4 are referred to as "ADCOUT1" to "ADCOUT4", respectively.

As shown in FIG. 2, in a case where the detected object 40 has moved from a position P1 to a position P2 during the transition from the period t1 (first period) to the period t2 (second period), the distance between the detected object 40 and the photodiodes PD1 and PD2 becomes longer and the distance between the detected object 40 and the photodiodes PD3 and PD4 becomes shorter. For this reason, the light intensity of light that is received by the photodiodes PD1 and PD2 during the period t2 becomes lower than the light intensity of light that is received by the photodiodes PD1 and PD2 during the period t1, and the light intensity of light that is received by the photodiodes PD3 and PD4 during the period t2 becomes higher than the light intensity of light that is received by the photodiodes PD3 and PD4 during the period t1.

Therefore, the digital values ADCOUT1 and ADCOUT2 are negative values, and the digital values ADCOUT3 and ADCOUT4 are positive values. From these results, the determination section 14 can determine that the detected object 40 has moved away from the photodiodes PD1 and PD2 toward the photodiodes PD3 and PD4 during the transition from the period t1 to the period t2.

This enables the motion sensor 11 to detect a hand motion or the like from amounts of change over time of the respective digital values ADCOUT1 to ADCOUT4 of the analog-digital conversion circuits ADC1 to ADC4.

[Configuration of an Analog-Digital Conversion Circuit as Schematically Shown]

The following schematically describes a configuration of an analog-digital conversion circuit according to the present invention. The analog-digital conversion circuits ADC1 to ADC4 as provided in any of the aforementioned various types of sensor device are configured such that even in a case where the sensor device is used under conditions where a highly intense disturbance DC light component such as sunlight is incident on the sensor device, the difference between electric currents of different periods can be highly accurately converted into a digital value. Since the analog-digital conversion circuits ADC1 to ADC4 are identical in configuration to each other, the following schematically describes a configuration of the analog-digital conversion circuit ADC1.

Figure 3:
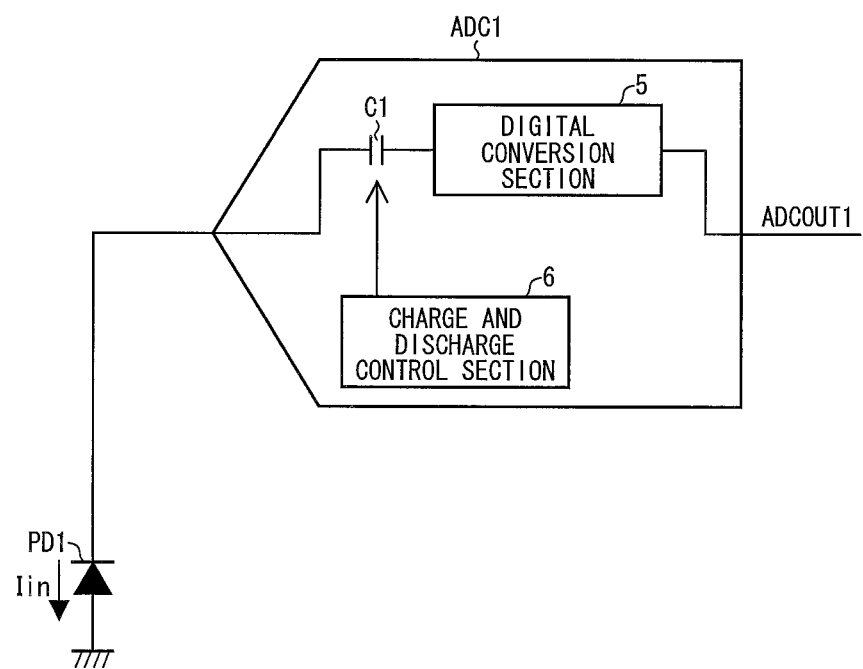
FIG. 3 is a diagram schematically showing a configuration of an analog-digital conversion circuit according to an aspect of the present invention.

FIG. 3 is a diagram schematically showing a configuration of the analog-digital conversion circuit ADC1. The analog-digital conversion circuit ADC1 is connected to the cathode of the photodiode PD1. The photodiode PD1 generates an electric current Iin according to the amount of light received.

The analog-digital conversion circuit ADC1 includes a capacitor (first capacitor) C1, a digital conversion section 5, and a charge and discharge control section 6.

The digital conversion section 5 has a function of converting the amount of electric charge stored in the capacitor C1 into a digital value. The digital value is outputted as the digital value ADCOUT1 from the analog-digital conversion circuit ADC1. As will be mentioned later, the digital conversion section 5 includes a counter etc.

The charge and discharge control section 6 has a function of controlling charge and discharge of the capacitor C1. Specifically, the charge and discharge control section 6 puts, into the capacitor C1, an electric charge corresponding to an electric current inputted to the analog-digital conversion circuit ADC1 during the period t1 (first period), and causes an electric charge corresponding to an electric current inputted to the analog-digital conversion circuit ADC1 during the period t2 (second period) to be discharged from the capacitor C1. Therefore, an electric charge obtained by subtracting the electric charge corresponding to the electric current inputted during the period t2 from the electric charge corresponding to the electric current inputted during the period t1 is stored in the capacitor C1.

An operation of the analog-digital conversion circuit ADC1 is further described in detail with reference to FIG. 4.

Figure 4:
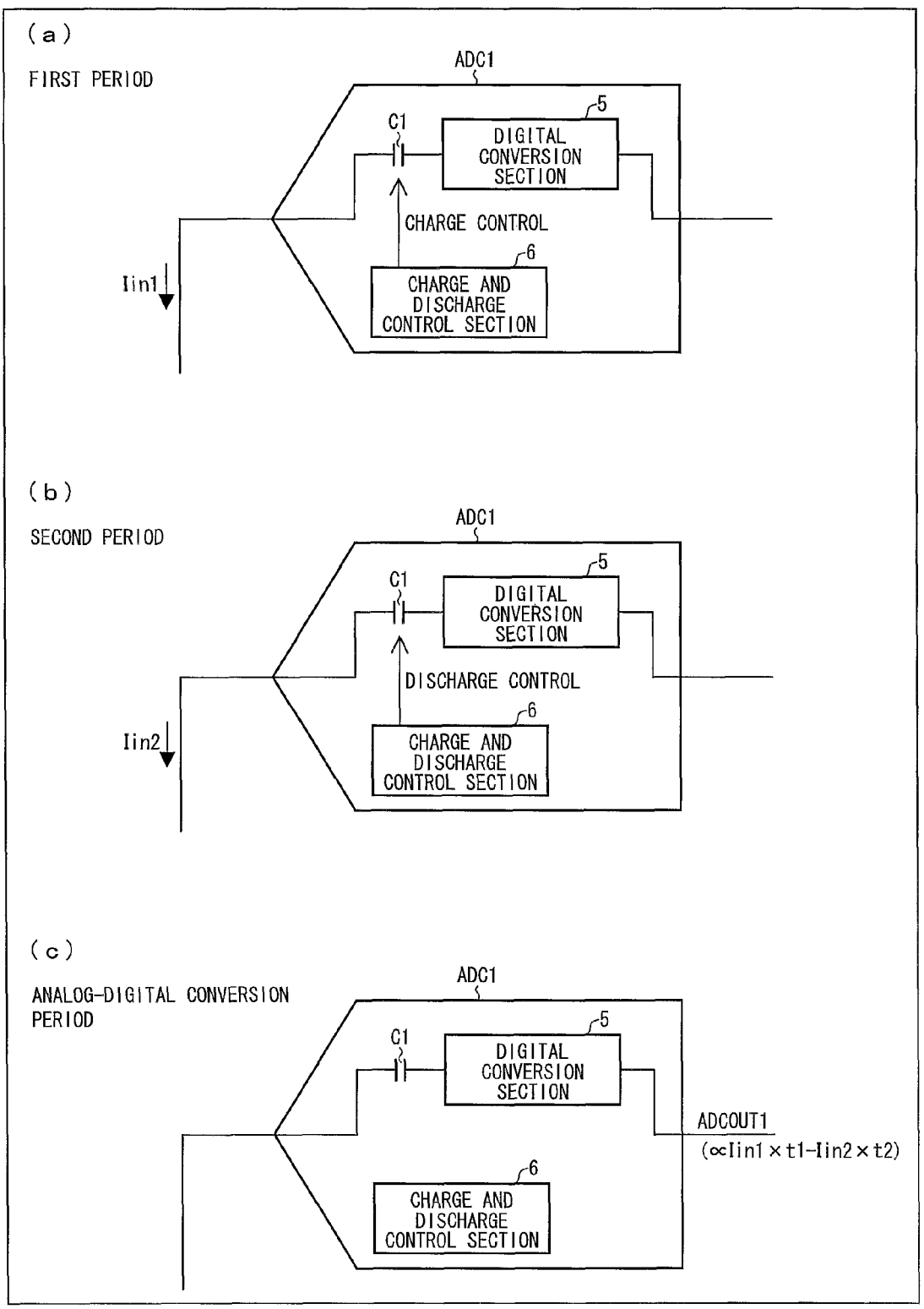
FIG. 4 is a set of diagrams (a) to (c) for explaining an operation of the analog-digital conversion circuit shown in FIG. 3.

As shown in (a) of FIG. 4, during the period t1, the charge and discharge control section 6 executes control so that the electric charge corresponding to the electric current inputted to the analog-digital conversion circuit ADC1 is stored in the capacitor C1. Suppose that no electric charge is stored in the capacitor C1 before the start of the period t1. Assuming that Iin1 is the input current that flows during the period t1, the electric charge Q1 that is put into the capacitor C1 during the period t1 is Iin1×t1.

As shown in (b) of FIG. 4, during the period t2 that follows the period t1, the charge and discharge control section 6 executes control so that the electric charge corresponding to the electric current inputted to the analog-digital conversion circuit ADC1 is discharged from the capacitor C1. Assuming that Iin2 is the input current that flows during the period t2, the electric charge Q2 that is discharged from the capacitor C1 during the period t2 is Iin2×t2. Therefore, the electric charge stored in the capacitor C1 at the end of the period t2 is given as $$Q1-Q2=Iin1 \times t1 - Iin2 \times t2.$$

In this way, the electric charge obtained by subtracting the electric charge corresponding to the electric current inputted during the period t2 from the electric charge corresponding to the electric current inputted during the period t1 is stored in the capacitor C1.

During an analog-digital conversion period that comes after the end of the period t2, the digital conversion section 5 converts the amount of electric charge stored in the capacitor C1 into a digital value. The digital value is outputted as the digital value ADCOUT1 from the analog-digital conversion circuit ADC1.

(Comparison with the Conventional Configuration)

Figure 18:
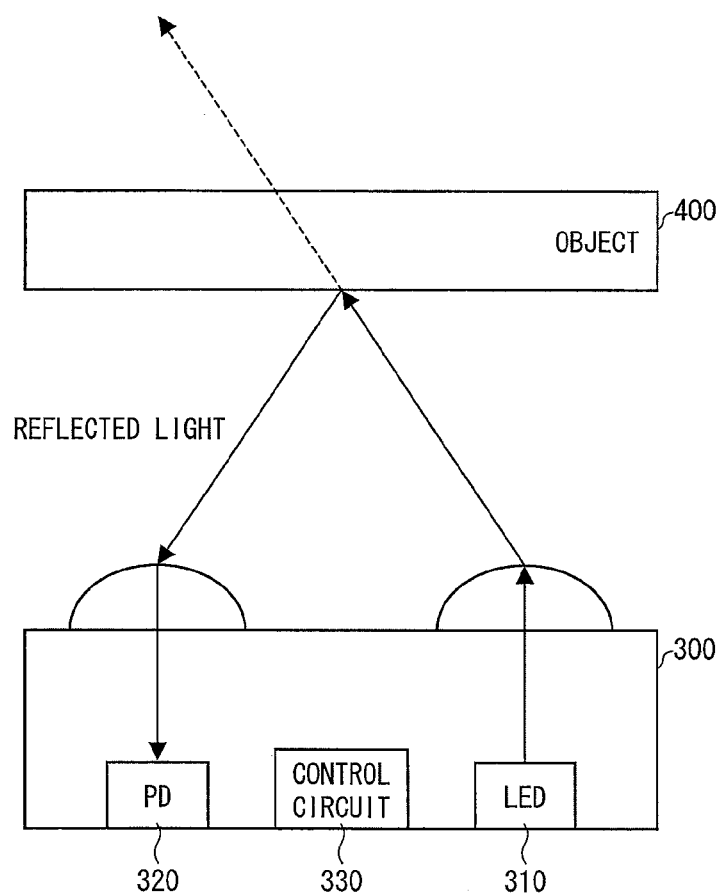
FIG. 18 is a diagram schematically showing a configuration of a general proximity sensor.
Figure 19:
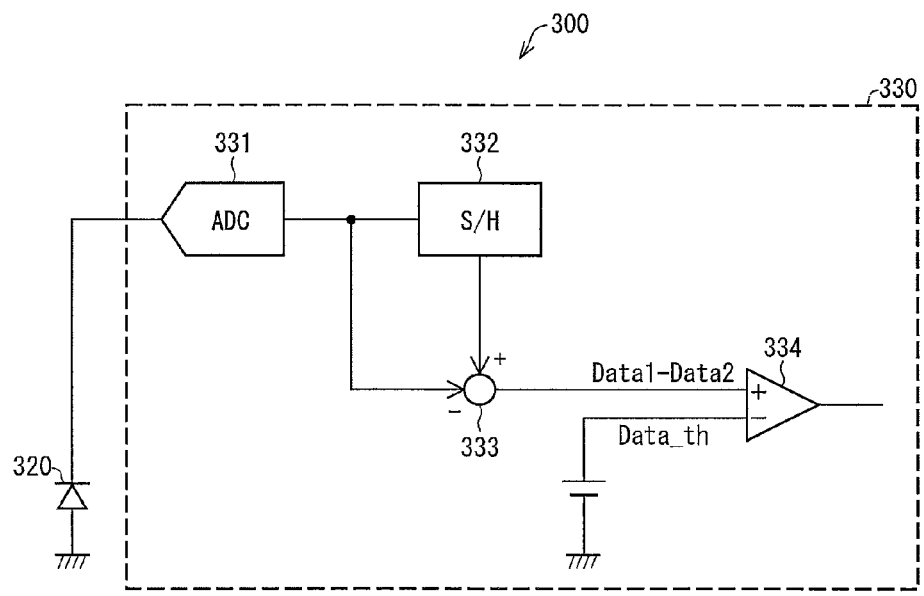
FIG. 19 is a diagram showing an example of a configuration of a control circuit of the proximity sensor shown in FIG. 18.
Figure 20:
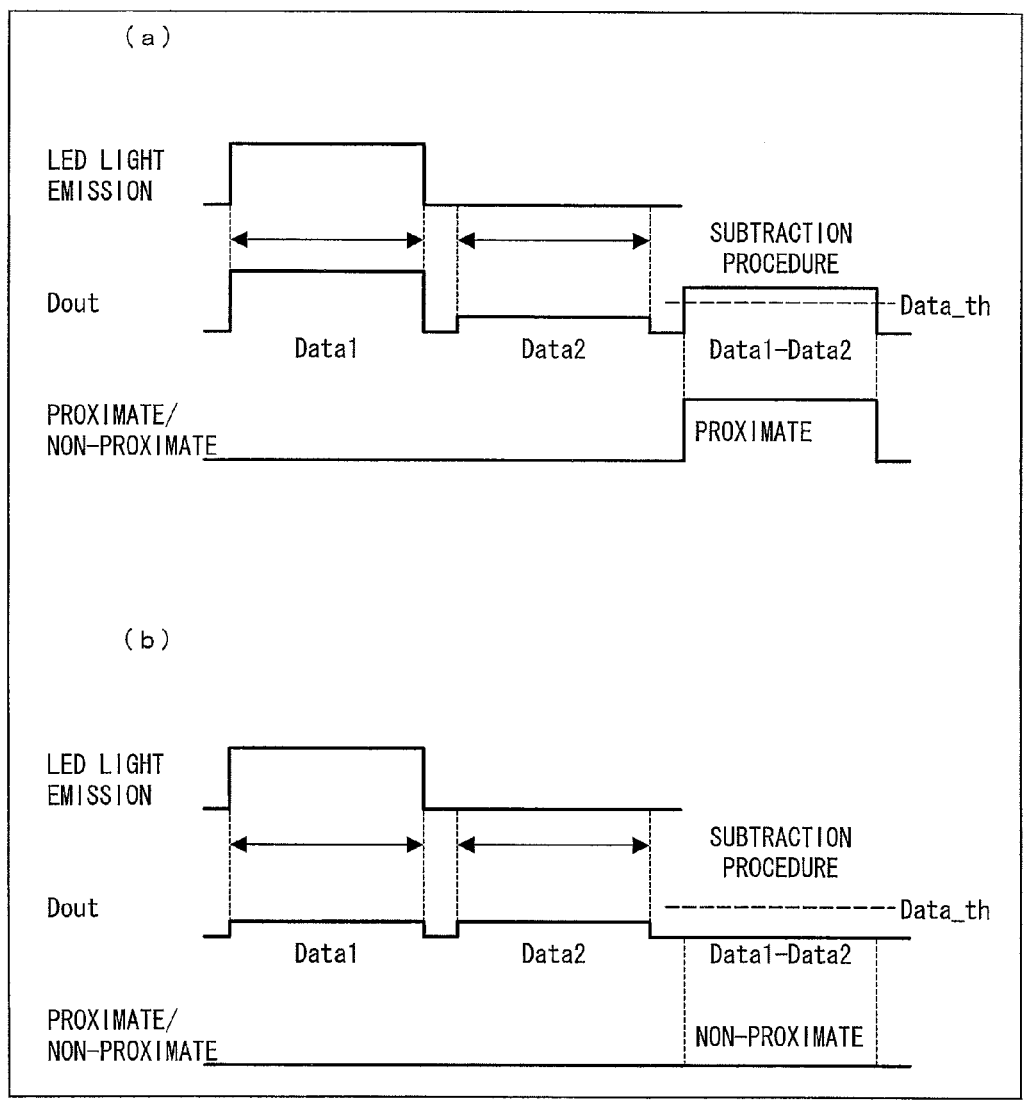
FIG. 20 is a set of waveform charts (a) and (b) showing the respective waveforms of pulse voltages etc. for driving a light-emitting diode of the proximity sensor shown in FIG. 18, (a) showing a case where there is an object near the proximity sensor, (b) showing a case where there is no object near the proximity sensor.
Figure 21:
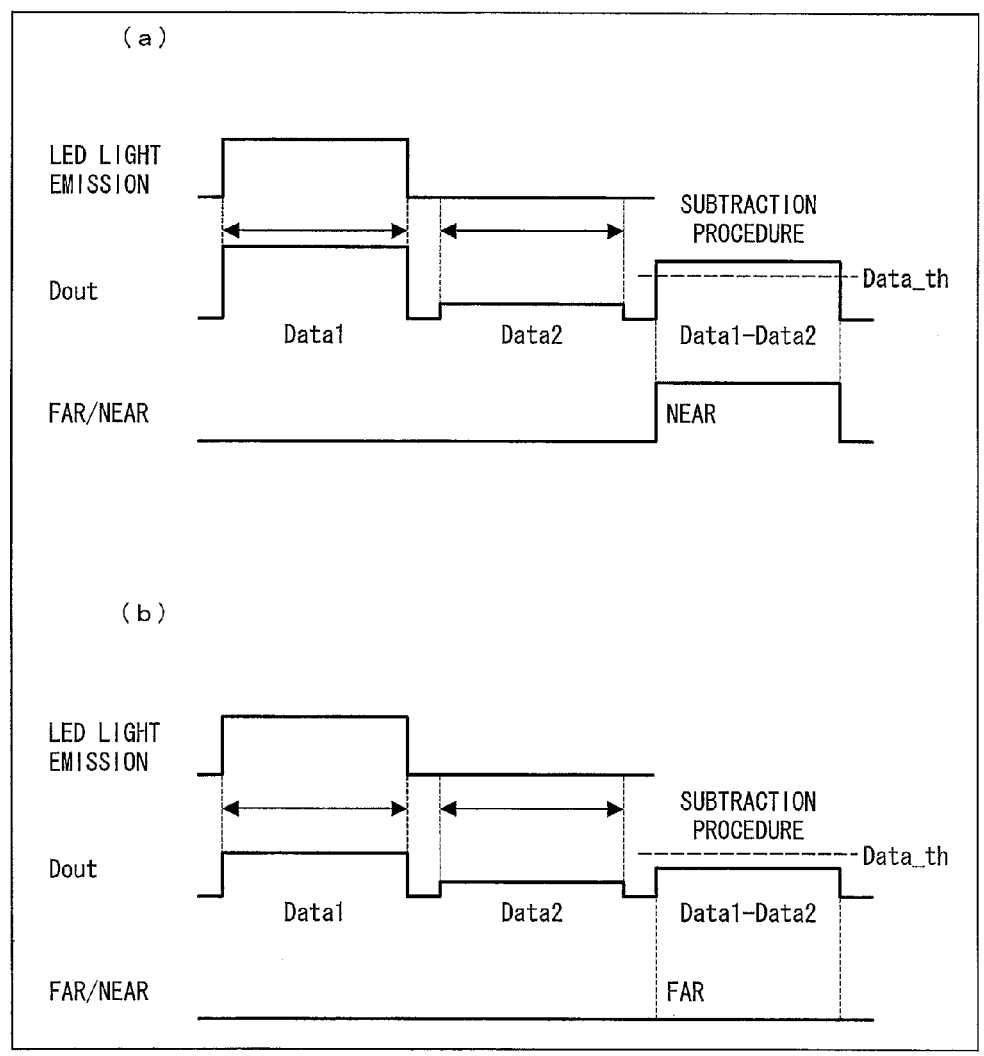
FIG. 21 is a set of waveform charts (a) and (b) showing the respective waveforms of pulse voltages etc. for driving the light-emitting diode of the proximity sensor shown in FIG. 18 in the case of the proximity sensor operating as a range sensor, (a) showing a case where there is an object detected at a short distance, (b) showing a case where there is an object detected at a long distance.

Here, in the conventional proximity sensor 300 shown in FIGS. 18 and 19, the analog-digital conversion circuit 331 converts the input current from the photodiode 320 during the period t1 and the input current from the photodiode 320 during the period t2 into the digital value Data1 and the digital value Data2, respectively, and then calculates the difference Data1−Data2 between them. For this reason, even in a case where the input currents contain highly intense DC components such sunlight, it is necessary to set the resolution of the analog-digital conversion circuit 331 high in order to obtain a precise value of the difference Data1−Data2. However, as the intensity of light reflected from the detected object is lower than the intensity of disturbance DC light, setting the resolution of the analog-digital conversion circuit 331 high lowers the percentage of reflected light components contained in the digital values Data1 and Data2, thus undesirably decreasing accuracy of measurement.

On the other hand, in the present embodiment, the analog-digital conversion circuit ADC1 outputs the difference between digital values corresponding to the electric currents Iin1 and Iin2 as a digital value DCOUT1 without converting the electric currents Iin1 and Iin2 into the respective digital values. For this reason, regardless of the magnitude of the electric currents Iin1 and Iin2, the resolution of the digital conversion section 5 can be set with respect to the difference (ADCOUT1) between the digital values corresponding to the electric currents Iin1 and Iin2. Here, in a case where the analog-digital conversion circuit ADC1 is used as a proximity sensor or a range sensor, the digital value ADCOUT1 corresponds to the intensity of light reflected from the detected object. For this reason, the resolution of the digital conversion section 5 can be set high even in a case where the electric currents Iin1 and Iin2 contain highly intense disturbance DC light components such as sunlight. Therefore, the analog-digital conversion circuit ADC1 can highly accurately convert the difference between electric currents inputted during different periods into a digital signal with a simple configuration.

Further, during an analog-digital conversion period, the first capacitor is neither charged nor discharged. That is, since charge and discharge of the first capacitor and an analog-digital conversion operation are separate from each other, the analog-digital conversion operation can be accurately performed even when the periods t1 and t2 are set short. For this reason, a sensor device including the analog-digital conversion circuit ADC1 is insusceptible to a change in disturbance DC light during the measuring time.

(Configuration in which a Charge and Discharge Cycle is Repeated)

Further, it is preferable that the charge and discharge control section 6 perform more than once a charge and discharge cycle including (i) charging the capacitor C1 during the first period and (ii) discharging the capacitor C1 during the second period. That is, by charging and discharging the capacitor C1 more than once, the electric charge obtained by subtracting the electric charge corresponding to the electric current inputted during the second period from the electric charge corresponding to the electric current inputted during the first period is integrally stored in the capacitor C for each charge and discharge cycle.

For example, a case where the charge and discharge cycle is performed twice is described. Let it be assumed that the first and second periods of the first charge and discharge cycle are a period t11 and a period t12, respectively, and that the first and second periods of the second charge and discharge cycle are a period t21 and a period t22, respectively. Further, assuming that Iin11 is the electric current that flows from the photodiode PD1 during the period t11, Iin12 is the electric current that flows from the photodiode PD1 during the period t12, Iin21 is the electric current that flows from the photodiode PD1 during the period t21, and Iin22 is the electric current that flows from the photodiode PD1 during the period t22, the electric charge that is put into the capacitor C1 at the end of the first cycle is given as $$Iin11 \times t11 - Iin12 \times t12.$$

With this charge put into the capacitor C1, the second cycle of charge and discharge is continuously performed. In the second cycle, the following charge is further put into the capacitor C1:

$$Iin21 \times t21 - Iin22 \times t22.$$

Therefore, at the end of the second cycle, the following charge is stored in the capacitor C1:

$$(Iin11 \times t11 - Iin12 \times t12) + (Iin21 \times t21 - Iin22 \times t22).$$

In this way, the electric charge obtained by subtracting the electric charge corresponding to the electric current inputted during the second period from the electric charge corresponding to the electric current inputted during the first period is integrally stored in the capacitor C for each of the first and second cycles. Therefore, the amount of electric charge stored can be converted into a digital value with more electric charge stored in the capacitor C1 than in a case where the capacitor C1 is charged and discharged only once. This makes it possible to further improve conversion accuracy.

The number of times the charge and discharge cycle is performed is set as appropriate according to the accuracy of measurement of which a sensor device to which the analog-digital conversion circuit ADC1 is applied is required. For example, in the present embodiment, the charge and discharge cycle is performed 16 times.

The following describes a specific example of a configuration of the aforementioned analog-digital conversion circuit ADC1.

[Embodiment 2]

A second embodiment of the present invention is described with reference to FIGS. 5 through 9. The present embodiment describes a case where an analog-digital conversion circuit including a single capacitor is applied to a proximity sensor.

(Configuration of a Proximity Sensor)

Figure 5:
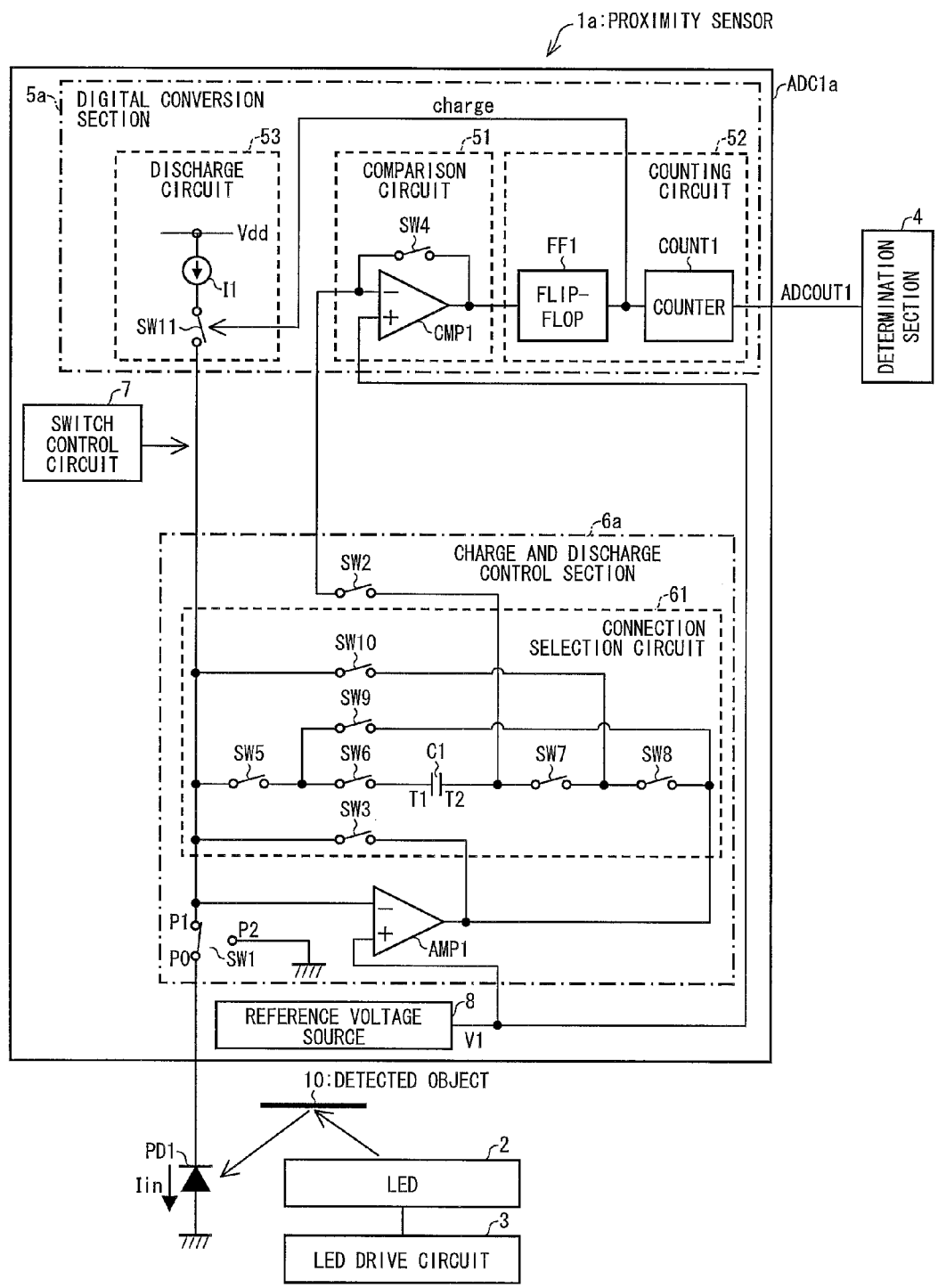
FIG. 5 is a diagram showing a configuration of a proximity sensor according to Embodiment 2 of the present invention.

FIG. 5 is a diagram showing a configuration of a proximity sensor 1*a* according to the present embodiment. The proximity sensor 1*a* is a specific example of a configuration of the proximity sensor shown in FIG. 1, and determines whether or not any detected object 10 is proximate. As shown in FIG. 5, the proximity sensor 1*a* includes a light-emitting diode (LED) 2, an LED drive circuit 3, a photodiode PD1, an analog-digital conversion circuit ADC1*a*, and a determination section 4.

The components of the proximity sensor 1*a* other than the analog-digital conversion circuit ADC1*a* are identical to those shown in FIG. 1. Further, the control of drive of the LED 2 by the LED drive circuit 3, too, is identical to the control in the proximity sensor 1*a* shown in FIG. 1. That is, the LED drive circuit 3 causes the LED 2 to be on during a period t1 (first period), and causes the LED 2 to be off during a period t2 (second period) that follows the period t1. In a case where the detected object 10 is proximate to the proximity sensor 1*a*, infrared light emitted from the LED 2 and reflected from the detected object 10 is incident on the photodiode PD1 during the period t1. Therefore, the light intensity of light that is received by the photodiode PD1 during the period t1 is higher than the light intensity of light that is received by the photodiode PD1 during the period t2. That is, assuming that Iin1 is the electric current that is generated by the photodiode PD1 during the period t1 and Iin2 is the electric current that is generated by the photodiode PD1 during the period t2, Iin1>Iin2.

(Configuration of the Analog-digital Conversion Circuit)

The analog-digital conversion circuit ADC1a is a specific example of a configuration of the analog-digital conversion circuit ADC1 shown in FIGS. 1 and 3. As shown in FIG. 5, the analog-digital conversion circuit ADC1a includes a capacitor C1, a digital conversion section 5a, a charge and discharge control section 6a, a switch control circuit 7, and a reference voltage source 8.

The switch control circuit 7 is a circuit that controls whether the after-mentioned switches SW1 to SW10 are on or off. The reference voltage source 8 applies a reference voltage V1 to an inverting input terminal of the after-mentioned operational amplifier AMP1 and to an inverting input terminal of a comparator CMP1.

The digital conversion section 5a has a function of converting the amount of electric charge stored in the capacitor C1 into a digital value, and includes a comparison circuit 51, a counting circuit 52, and a discharge circuit 53. The digital value is outputted as a digital value ADCOUT1 to the determination section 4. A configuration of the digital conversion section 5a will be described in detail later.

The charge and discharge control section 6a includes a connection selection circuit 61, an operational amplifier AMP1, and switches SW1 and SW2 (second switch), and has a function of controlling charge and discharge of the capacitor C1. Specifically, the charge and discharge control section 6a puts, into the capacitor C1, an electric charge corresponding to an electric current inputted to the analog-digital conversion circuit ADC1a during the period t1 (first period), and causes an electric charge corresponding to an electric current inputted to the analog-digital conversion circuit ADC1a during the period t2 (second period) to be discharged from the capacitor C1. Therefore, an electric charge obtained by subtracting the electric charge corresponding to the electric current inputted during the period t2 from the electric charge corresponding to the electric current inputted during the period t1 is stored in the capacitor C1.

The switch SW1 (first switch) is a switch that serves to switch between connecting the photodiode PD1 and the analog-digital conversion circuit ADC1a to each other and disconnecting the photodiode PD1 and the analog-digital conversion circuit ADC1a from each other. The switch SW1 includes three nodes P0, P1, and P2, and can switch between connecting the node P0 to the node P1 and connecting the node P0 to the node P2. In the case where the node P0 is connected to the node P1, the electric current from the photodiode PD1 is inputted to the analog-digital conversion circuit ADC1a. That is, the switch SW1 changes between being turned on to and being turned off not to input, to a negative input terminal of the operational amplifier AMP1, the electric current inputted to the analog-digital conversion circuit ADC1a.

The switch SW2 is a switch that changes between being turned on to connect and being turned off to disconnect the comparator CMP1 to or from a terminal T2 of the capacitor C1. The switch control circuit 7 controls the switch SW2 to be off during the periods t1 and t2, and controls the switch SW2 to be on during an analog-digital conversion period.

The operational amplifier AMP1 has its negative input terminal (inverting input terminal) connected to the node P1 of the switch SW1, to one end of the switch SW3, and to the connection selection circuit 61, and has its positive input terminal (non-inverting input terminal) connected to the reference voltage source 8. The operational amplifier AMP1 has its output terminal connected to the other end of the switch SW3 and to the connection selection circuit 61.

The connection selection circuit 61 includes eight switches SW2, SW3, and SW5 to SW10 and, by controlling these switches, can select a state of connection between two terminals T1 and T2 of the capacitor C1 and the photodiode PD1. Specifically, the connection selection circuit 61 can select between a first state of connection in which the negative input terminal and output terminal of the operational amplifier AMP1 are connected to the terminals T1 and T2 of the capacitor C1, respectively, and a second state of connection in which the negative input terminal and output terminal of the operational amplifier AMP1 are connected to the terminals T2 and T1 of the capacitor C1, respectively.

One end of the switch SW5 is connected to one end of the switch SW3, the negative input terminal of the operational amplifier AMP1, the node P1 of the switch SW1, one end of the switch SW10, and the discharge circuit 53. The other end of the switch SW5 is connected to one end of the switch SW6 and one end of the switch SW9. The other end of the switch SW6 is connected to the terminal T1 of the capacitor C1. The terminal T2 of the capacitor C1 is connected to one end of the switch SW2 and one end of the switch SW7. The other end of the switch SW7 is connected to one end of the switch SW8 and the other end of the switch SW10. The other end of the switch SW8 is connected to the other end of the switch SW3, the output terminal of the operational amplifier AMP1, and the other end of the switch SW9.

The following describes a configuration of the digital conversion section 5a in detail. As mentioned earlier, the digital conversion section 5a includes the comparison circuit 51, the counting circuit 52, and the discharger circuit 53.

The comparison circuit 51 is a circuit that compares the voltage at the terminal T2 of the capacitor C1 with the reference voltage V1, and includes the comparator CMP1 and a switch SW4. The comparator CMP1 has its positive input terminal (non-inverting input terminal) connected to the other end of the switch SW2 and to one end of the switch SW4, and has its negative input terminal (inverting input terminal) to the reference voltage source 8. Through this, the comparator CMP1 compares the voltage at the terminal T2 of the capacitor C1 with the reference voltage V1 when the switch SW2 is on. The comparator CMP1 has its output terminal connected to the other end of the switch SW4 and to the counting circuit 52.

The counting circuit 52 is a circuit that counts a discharge period of the discharge circuit 53 in accordance with the output from the comparator CMP1 and outputs a digital value corresponding to the discharge period, and includes a flip-flop FF1 and a counter COUNT1. When the switch SW2 becomes turned on and the voltage at the negative input terminal of the comparator CMP1 becomes higher than the voltage at the positive input terminal, the output signal from the comparator CMP1 becomes low. Along with this, the flip-flop FF1 makes a discharge control signal charge, which is an output signal, low in synchronization with a rising edge of a clock signal that is inputted from a clock generation source (not illustrated). The discharge control signal charge is inputted to the counter COUNT1, and serves as a control signal that controls whether the switch SW1 is on or off. The counter COUNT1 counts the number of clocks during a period in which the discharge control signal charge is low, and outputs the resulting count value as a digital value ADCOUT1 to the determination circuit 4.

That is, the counting circuit 52 counts the number of clocks of the clock signal during a period from a point in time where the comparator CMP1 determined that the voltage at the terminal T2 of the capacitor C1 is higher than the reference voltage V1 to a point in time where the comparator CMP1 determines that the voltage at the terminal T2 of the capacitor C1 is lower than the reference voltage V1.

The discharge circuit 53 includes a current source and a switch SW11. The current source is connected to the charge and discharge control section 6a via the switch SW11, and generates a reference current I1 by which an electric charge stored in the capacitor C1 is discharged. The switch SW is a switch that changes between being turned on to and being turned off not to discharge.

As above, the switch SW11 is on during a period in which the discharge control signal charge is low. Through this, the discharge circuit 53 uses the current source to cause the capacitor C1 to discharge at a predetermined speed while the comparator CMP1 determines that the voltage at the terminal T2 of the capacitor C1 is higher than the reference voltage V1.

The determination section 4 serves to determine whether or not the detect object 10 is proximate. Specifically, the determination section 4 compares the digital value ADCOUT1 outputted from the analog-digital conversion circuit ADC1 with the predetermined threshold value Data_th and, in a case where the digital value ADCOUT1 is greater than the threshold value Data_th, determines that the detected object 10 is proximate.

(Operation of the Proximity Sensor)

The following describes an operation of the proximity sensor 1a thus configured. The proximity sensor 1a switches its operation for each of the following periods: a preparatory period, a period t1 (first period), a period t2 (second period), and an analog-digital conversion period.

FIGS. 6 through 9 are diagrams for explaining the operations of the proximity sensor 1a during the preparatory period, the period t1, the period t2, and the analog-digital conversion period, respectively. For convenience, FIGS. 6 through 9 omit to illustrate the switches and wires through which no electric currents flow when the switches are off.

(Preparatory Period)

The preparatory period precedes the period t1. In the preparatory period, an electric charge for cancelling out the effect of offset voltages of the operational amplifier AMP1 and of the comparator CMP1 is put into the capacitor C1 for the avoidance of an error in output value of the analog-digital conversion circuit ADC1a due to the offset voltages.

In the preparatory period, the switch control circuit 7 controls each of the switches shown in FIG. 5 so that the node P0 of the switch SW1 is connected to the node P1 of the switch SW1, that the switch SW2 is turned on, that the switch SW3 is turned on, that the switch SW4 is turned on, that the switch SW5 is turned on, that the switch SW6 is turned on, that the switch SW7 is turned off, that the switch SW8 is turned off, that the switch SW9 is turned off, that the switch SW10 is turned off, and that the switch SW11 is turned off. This places the proximity sensor 1a in a state shown in FIG. 6. During the preparatory period, the LED 2 is not driven.

Figure 6:
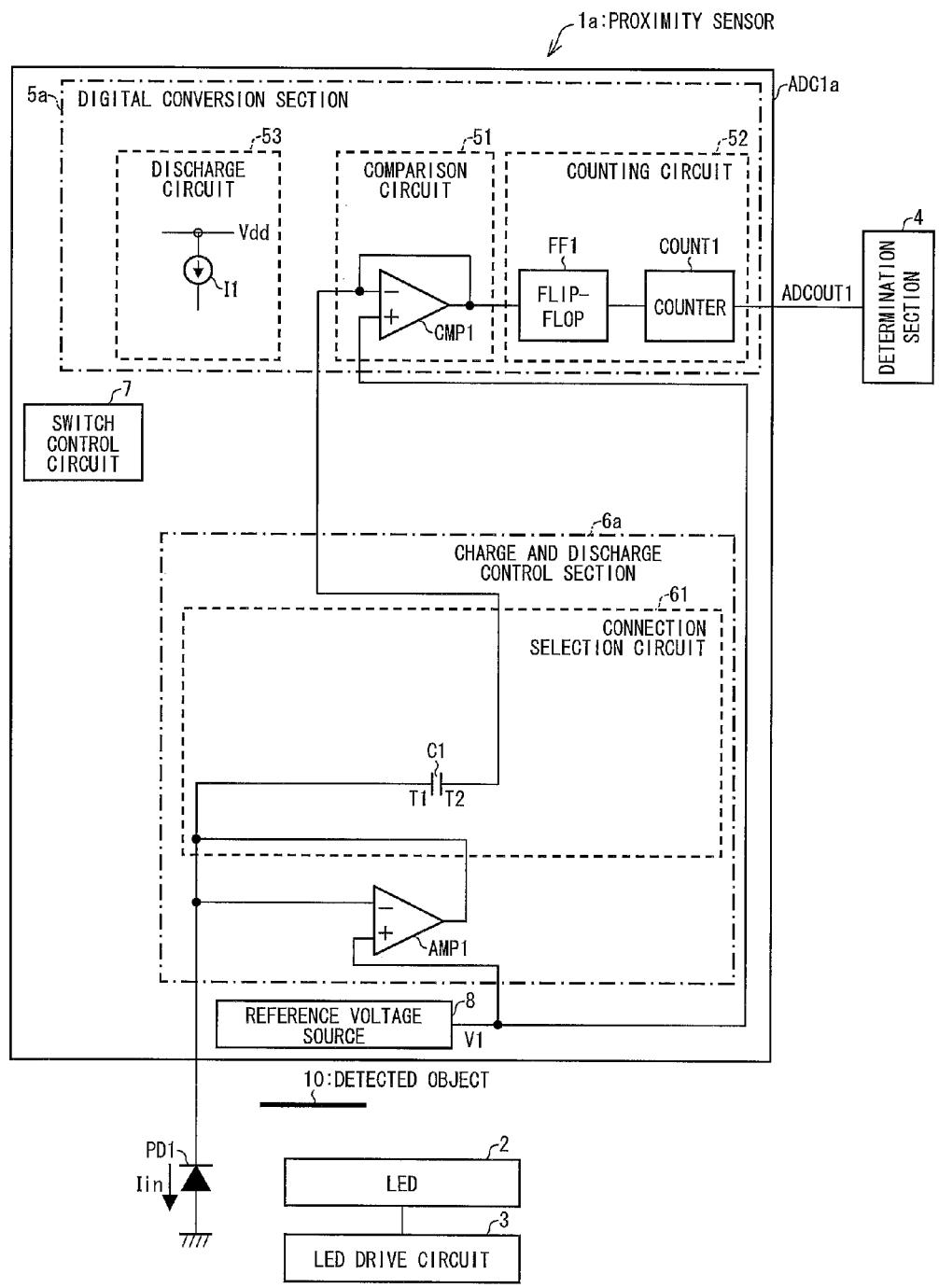
FIG. 6 is a diagram showing a state of the proximity sensor shown in FIG. 5 during a preparatory period.

In FIG. 6, the negative input terminal and output terminal of the operational amplifier AMP1 are both connected to the terminal T1 of the capacitor C1. Further, since the switches SW2 and SW4 are on, the negative input terminal and output terminal of the comparator CMP1 are both connected to the terminal T2 of the capacitor C1. This causes an electric charge corresponding to the difference between the offset voltage of the operational amplifier AMP1 and the offset voltage of the comparator CMP1 in the comparison circuit 51 to be put into the capacitor C1.

Specifically, assuming that Vamp is the offset voltage of the operational amplifier AMP1, an imaginary short circuit between the positive input terminal and negative input terminal of the operational amplifier AMP1 is caused by a short circuit caused between the output terminal and negative input terminal of the operational amplifier AMP1. Since the voltage at the positive input terminal of the operational amplifier AMP1 is the reference voltage V1 from the reference voltage source 8, the voltage at the negative input terminal of the operational amplifier AMP1 is V1+Vamp. Therefore, the voltage at the terminal T1 of the capacitor C1 is V1+Vamp.

Meanwhile, assuming that Vcmp is the offset voltage of the comparator CMP1, an imaginary short circuit between the positive input terminal and negative input terminal of the comparator CMP1 is caused by a short circuit caused between the output terminal and negative input terminal of the comparator CMP1. This causes the voltage at the positive input terminal of the comparator CMP1 to be V1 and causes the voltage at the negative input terminal of the comparator CMP1 to be V1+Vcmp. Therefore, the voltage at the terminal T2 of the capacitor C1 is V1+Vcmp.

As above, the voltage at the terminal T1 of the capacitor C1 is V1+Vamp and the voltage at the terminal T2 of the capacitor C1 is V1+Vcmp. Therefore, assuming that $C\_1$ is the capacitance of the capacitor C1, an electric charge of $+C\_1\times$(Vamp−Vcmp) is put into the capacitor C1 via the terminal T1, and an electric charge of $-C\_1\times$(Vamp−Vcmp) is put into the capacitor C1 via the terminal T2.

Since electric charges of such values are stored in the capacitor C1, the digital conversion section 5a can accurately convert the difference between an electric charge corresponding to an input current during the first period and an electric charge corresponding to an input current during the second period into a digital value even in a case where there are offset voltages at the operational amplifier AMP1 and the comparator CMP1 during the analog-digital conversion period as will be described later.

Although the LED 2 emits no light during the preparatory period, an input current from the photodiode PD1 by disturbance DC light flows through the charge and discharge control section 6a, as the disturbance DC light is incident on the photodiode PD1. However, this input current flows from the output terminal of the operational amplifier AMP1 toward the photodiode PD1, and as such, is not put into the capacitor C1.

Further, in the absence of offset voltages at the operational amplifier AMP1 and the comparator CMP1, no electric charge is stored in the capacitor C1 at the end of the preparatory period. That is, the potential difference between the terminals T1 and T2 of the capacitor C1 is 0 V at the end of the preparatory period.

(First Period)

During the period t1 (first period) that follows the preparatory period, the switches are controlled so that an electric charge corresponding to an electric current generated by the photodiode PD1 is put into the capacitor C1. Specifically, the switch control circuit 7 controls each of the switches shown in FIG. 5 so that the node P0 of the switch SW1 is connected to the node P1 of the switch SW1, that the switch SW2 is turned off, that the switch SW3 is turned off, that the switch SW4 is turned on, that the switch SW5 is turned on, that the switch SW6 is turned on, that the switch SW7 is turned on, that the switch SW8 is turned on, that the switch SW9 is turned off, that the switch SW10 is turned off, and that the switch SW11 is turned off. This places the proximity sensor 1a in a state shown in FIG. 7.

Further, during the period t1, the LED drive circuit 3 drives the LED 2. In a case where the detected object 10 is proximate, infrared light emitted from the LED 2 and reflected by the detected object 10 is incident on the photodiode PD1, together with disturbance DC light. Accordingly, the photodiode PD1 generates an electric current corresponding to the combined intensity of disturbance DC light and infrared light.

Figure 7:
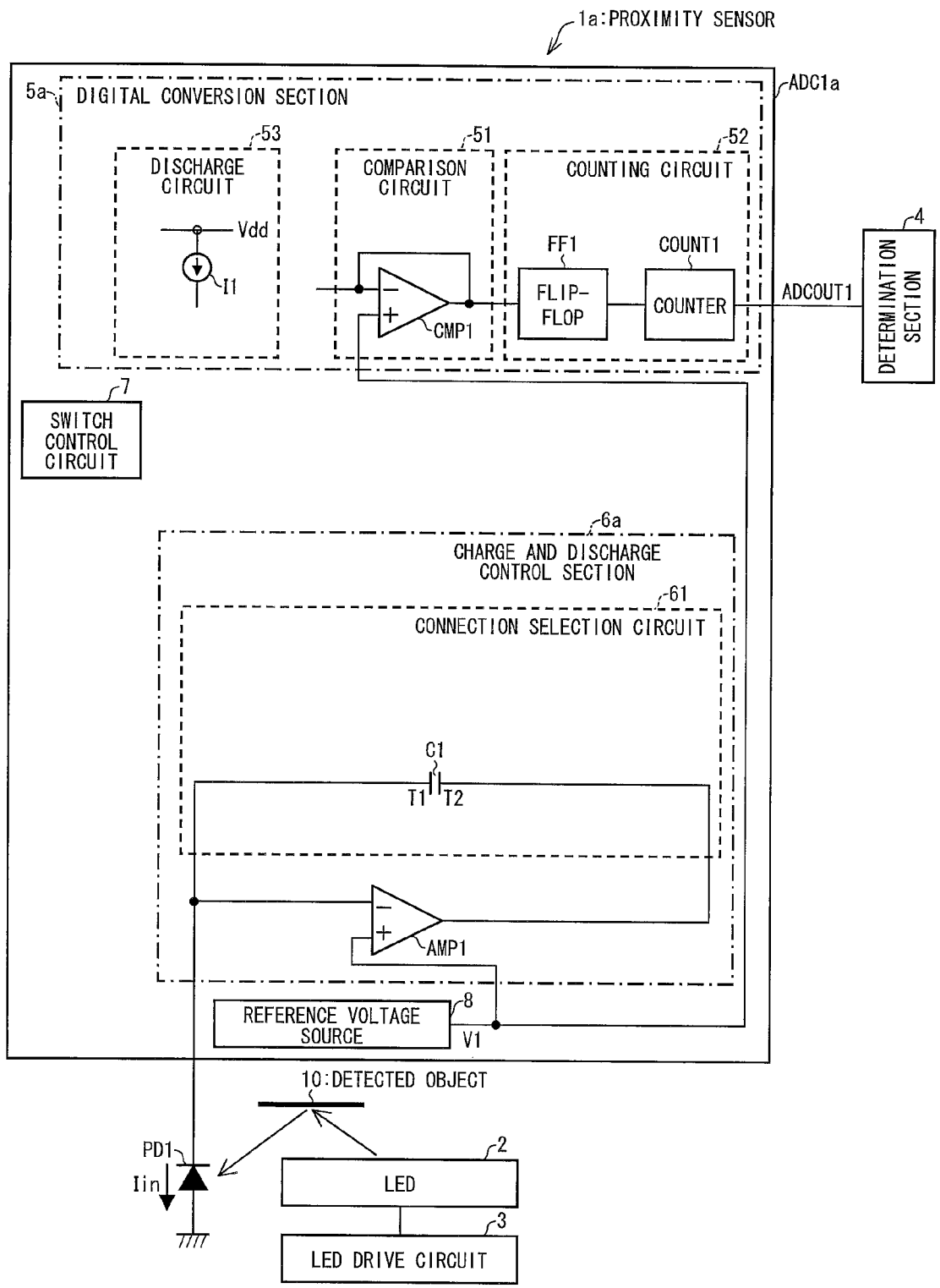
FIG. 7 is a diagram showing a state of the proximity sensor shown in FIG. 5 during a first period.

In FIG. 7, the connection selection circuit 61 selects the first state of connection in which the negative input terminal and output terminal of the operational amplifier AMP1 are connected to the terminals T1 and T2 of the capacitor C1, respectively. That is, the negative input terminal and output terminal of the operational amplifier AMP1 are connected to each other via the capacitor C1, and there is an imaginary short circuit between the positive input terminal and negative input terminal of the operational amplifier AMP1. This causes the cathode voltage of the photodiode PD1 to be fixed at the voltage V1+Vamp at the terminal T1 of the capacitor C1 during the preparatory period.

Further, the photodiode PD1 is connected solely to the terminal T1 of the capacitor C1 and the negative input terminal of the operational amplifier AMP1. Therefore, assuming that $t\_1$ is the duration of the period t1 and $Iin\_1$ is the electric current generated by the photodiode PD1, an electric charge ($t\_1 \times Iin\_1$) corresponding to the electric current $Iin\_1$ that flows for the duration $t\_1$ flows out of the capacitor C1 via the terminal T1. This causes the terminal T1 of the capacitor C1 to carry an electric charge of $-t\_1 \times Iin\_1 + C\_1 \times (Vamp-Vcomp)$, including the electric charge that was put into the capacitor C1 during the preparatory period.

Meanwhile, the electric charge supply from the output terminal of the operational amplifier AMP1 causes the terminal T2 of the capacitor C1 to carry an electric charge of $+t\_1 \times Iin\_1 - C\_1 \times (Vamp-Vcomp)$, which is equal in absolute quantity and opposite in sign to the electric charge at the terminal T1 of the capacitor C1.

It should be noted that the voltage at the terminal T2 of the capacitor C1 is as follows:

$$V1+Vamp+\{+t\_1 \times Iin\_1-C\_1 \times (Vamp-Vcomp)\}/C\_1 = V1+Vcomp+(+t\_1 \times Iin\_1)/C\_1.$$

The capacitance $C\_1$ of the capacitor C1 is set so that this voltage falls short of the output dynamic range of the operational amplifier AMP1.

(Second Period)

During the period t2 (second period) that follows the period t1, the switches are controlled so that the electric charge corresponding to the electric current generated by the photodiode PD1 is discharged from the capacitor C1. Specifically, the switch control circuit 7 controls each of the switches shown in FIG. 5 so that the node P0 of the switch SW1 is connected to the node P1 of the switch SW1, that the switch SW2 is turned off, that the switch SW3 is turned off, that the switch SW4 is turned on, that the switch SW5 is turned off, that the switch SW6 is turned on, that the switch SW7 is turned on, that the switch SW8 is turned off, that the switch SW9 is turned on, that the switch SW10 is turned on, and that the switch SW11 is turned off. This places the proximity sensor 1a in a state shown in FIG. 8.

During the period t2, the LED 2 is not driven. Therefore, only disturbance DC light is incident on the photodiode PD1, and the photodiode PD1 generates an electric current corresponding to the intensity of disturbance DC light. Further, the duration $t\_2$ of the period t2 is set to be equal to the duration $t\_1$ of the period t1.

Figure 8:
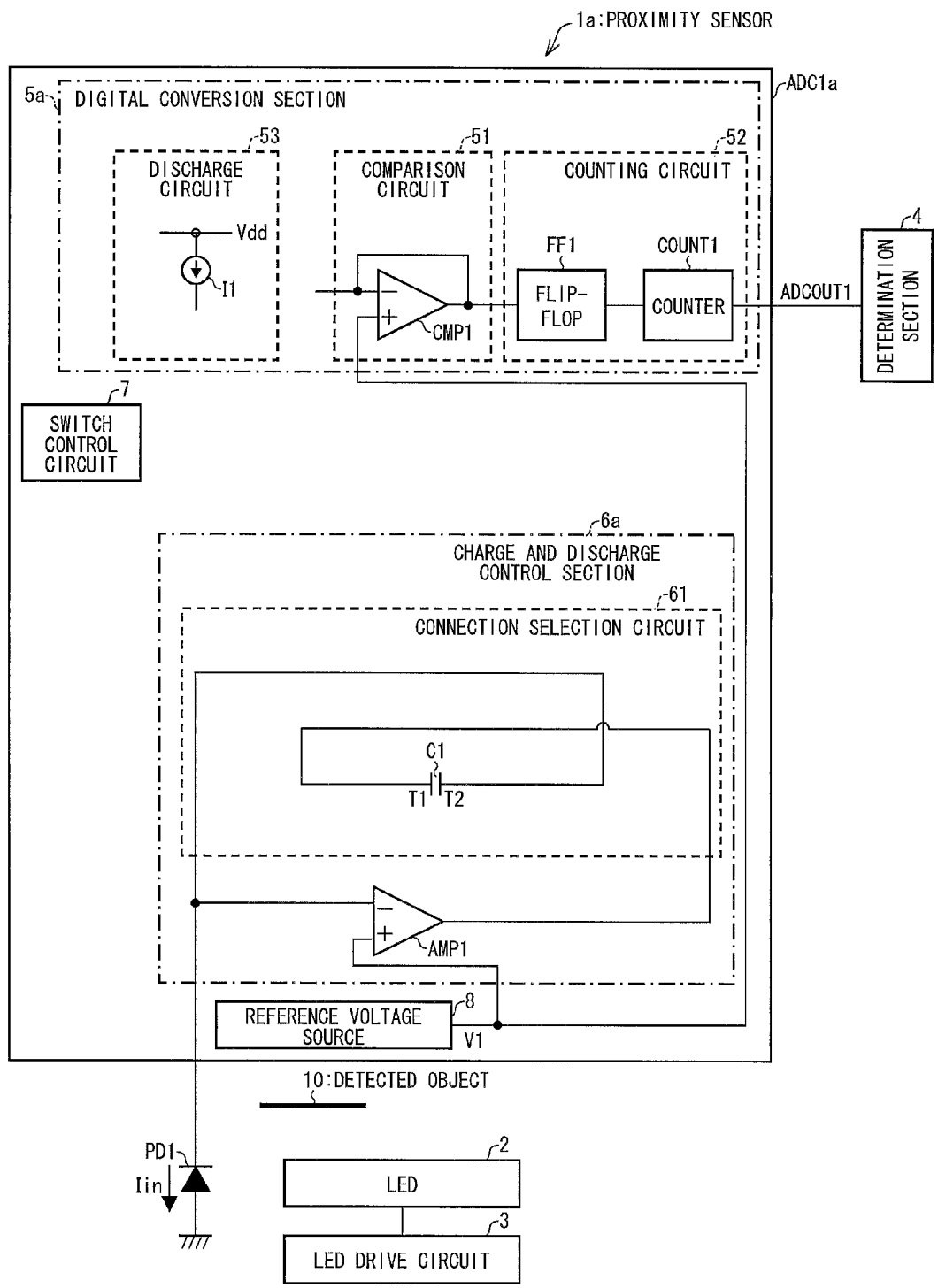
FIG. 8 is a diagram showing a state of the proximity sensor shown in FIG. 5 during a second period.
Figure 9:
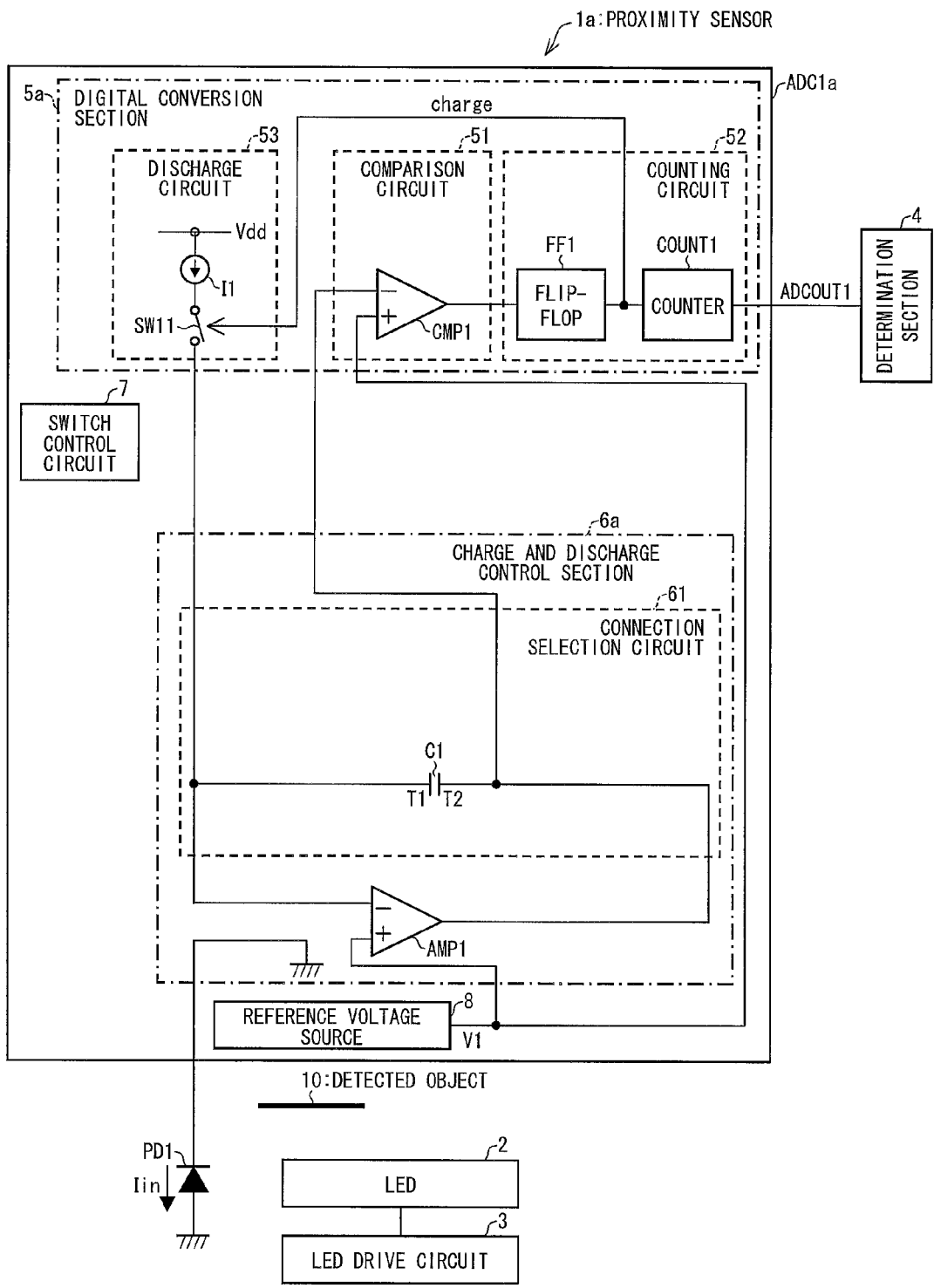
FIG. 9 is a diagram showing a state of the proximity sensor shown in FIG. 5 during an analog-digital conversion period.

In FIG. 8, the connection selection circuit 61 selects the second state of connection in which the negative input terminal and output terminal of the operational amplifier AMP1 are connected to the terminals T2 and T1 of the capacitor C1, respectively. That is, the output terminal and negative input terminal of the operational amplifier AMP1 are connected to each other via the capacitor C1, and there is an imaginary short circuit between the positive input terminal and negative input terminal of the operational amplifier AMP1. This causes the cathode voltage of the photodiode PD1 to be fixed at the voltage V1+Vamp at the terminal T1 of the capacitor C1 during the preparatory period and the period t1.

Further, the photodiode PD1 is connected solely to the terminal T2 of the capacitor C1 and the negative input terminal of the operational amplifier AMP1. Therefore, assuming that $Iin\_2$ is the electric current generated by the photodiode PD1, an electric charge ($t\_2 \times Iin\_2$) corresponding to the electric current $Iin\_2$ that flows for the duration $t\_2$ flows out of the capacitor C1 via the terminal T2. This causes the terminal T2 of the capacitor C1 to carry an electric charge of $-t\_2 \times Iin\_2 + t\_1 \times Iin\_1 - C\_1 \times (Vamp-Vcomp)$, excluding an electric charge of $t\_2 \times Iin\_2$ from the electric charge that was stored at the end of the period t1.

Meanwhile, the electric charge supply from the output terminal of the operational amplifier AMP1 causes the terminal T1 of the capacitor C1 to carry an electric charge of $+t\_2 \times Iin\_2 - t\_1 \times Iin\_1 + C\_1 \times (Vamp-Vcomp)$, which is equal in absolute quantity and opposite in sign to the electric charge at the terminal T2 of the capacitor C1.

(Analog-digital Conversion Period)

During the analog-digital conversion period that follows the period t2, the switches are controlled so that the electric charge stored in the capacitor C1 at the end of the period t2 is converted into a digital value by the digital conversion section 5a. Specifically, the switch control circuit 7 controls each of the switches shown in FIG. 5 so that the node P0 of the switch SW1 is connected to the node P2 of the switch SW1, that the switch SW2 is turned on, that the switch SW3 is turned off, that the switch SW4 is turned off, that the switch SW5 is turned on, that the switch SW6 is turned on, that the switch SW7 is turned on, that the switch SW8 is turned on, that the switch SW9 is turned off, and that the switch SW10 is turned off. Further, the switch SW11 is turned on only during a period in which the discharge control signal charge is low. This places the proximity sensor 1a in a state shown in FIG. 9.

During the analog-digital conversion period, the LED 2 is not driven. Therefore, only disturbance DC light is incident on the photodiode PD1, and the photodiode PD1 generates an electric current corresponding to the intensity of disturbance DC light. However, since the photodiode PD1 has its cathode connected to GND, the disturbance DC light does not affect the operation of analog-digital conversion.

At the end of the period t2 (i.e. at the start of the analog-digital conversion period), an electric charge of $-t\_2 \times Iin\_2 + t\_1 \times Iin\_1 - C\_1 \times (Vamp-Vcomp)$ is stored at the terminal T2 of the capacitor C1; therefore, the voltage at the terminal T2 of the capacitor C1 is as follows:

$$V1+Vamp+\{-t\_2 \times Iin\_2+t\_1 \times Iin\_1-C\_1 \times (Vamp-Vcomp)\}/C1 = V1+Vcomp+(-t\_2 \times Iin\_2+t\_1 \times Iin\_1)/C\_1.$$

This voltage is applied to the negative input terminal of the comparator CMP1, and the voltage V1 from the reference voltage source 8 is applied to the positive input terminal of the comparator CMP1. Since the voltage at negative input terminal is higher than the voltage at the positive input terminal, the comparator CMP1 outputs a low signal. Since the discharge control signal charge is low during a period in which the output signal from the comparator CMP1 is low, the switch SW11 is turned on. At the timing when the switch SW11 is on, the discharge circuit 53 allows passage of a reference current I1 and discharges the electric charge carried by the terminal T1 of the capacitor C1. This lowers the voltage at the terminal T2 of the capacitor C1.

After that, the output from the comparator CMP1 switches from low to high when the voltage at the negative input terminal of the comparator CMP1 (i.e. the voltage at the terminal T2 of the capacitor C1) becomes lower than V1+Vcmp. This causes the discharge control signal charge to be high, and the switch SW11 is turned off.

The counting circuit 52 is controlled by clocks. The counter COUNT1 counts the number of clocks during a period from a point in time where the output from the comparator CMP1 became low to a point in time where the output from the comparator CMP1 switches to high, and outputs the resulting count value as a digital value ADCOUT1 to the determination section 4. The determination section 4 compares the digital value ADCOUT1 with a predetermined threshold value, and determines, on the basis of a result of the comparison, whether or not the detected object 10 is proximate to the proximity sensor 1b.

The following discusses the amount of electric charge that is discharged by the reference current I1 during a period from a point in time where the voltage at the negative input terminal of the comparator CMP1 (i.e. the voltage at the terminal T2 of the capacitor C1) started to become lower to a point in time where the potential difference between the negative input terminal and the positive input terminal becomes Vcmp (i.e. the voltage at the negative input terminal becomes V1+Vcmp). The electric charge carried by the terminal T1 of the capacitor C1 at the point in time where the voltage at the negative input terminal of the comparator CMP1 becomes V1+Vcmp is $+C\_1 \times (Vamp-Vcmp)$. On the other hand, the electric charge at the terminal T1 of the capacitor C1 at the start of the analog-digital conversion period is $+t\_2 \times Iin\_2 - t\_1 \times Iin\_1 + C\_1 \times (Vamp-Vcomp)$. Therefore, the electric charge that is discharged from the capacitor C1 via the terminal T1 by the reference current I1 is as follows:

$$\{+t\_2 \times Iin\_2 - t\_1 \times Iin\_1 + C\_1 \times (Vamp-Vcomp)\} - C\_1 \times (Vamp-Vcmp) = +t\_2 \times Iin\_2 - t\_1 \times Iin\_1.$$

Note here that the electric charge that was carried by the terminal T1 of the capacitor C1 at the end of the preparatory period is of $+C\_1 \times (Vamp-Vcmp)$. Therefore, even in a case where offset voltages occur in the operational amplifier AMP1 and the comparator CMP1, the only charge that is discharged by the reference current I1 is $(+t\_2 \times Iin\_2 - t\_1 \times Iin\_1)$, which is obtained by subtracting the electric charge corresponding to the input current during the period t2 from the electric charge corresponding to the input current during the period t1.

Assuming that t_clk is a single cycle of clock that is inputted to the counter COUNT1 and count is the value obtained by the counter COUNT1 counting discharge time, (Charge That Is Charged into Capacitor C1 via Terminal T1)+(Charge That Is Discharged out of Capacitor C1 via Terminal T1)=0; therefore, Eq. (1) holds as follows:

$$t\_clk \times count \times I1 + (+t\_2 \times Iin\_2 - t\_1 \times Iin\_1) = 0 \quad count = (t\_1 \times Iin\_1 - t\_2 \times Iin\_2)/(t\_clk \times I1) \quad \text{Eq. (1)}.$$

That is, the count value of the counter COUNT1 corresponds to the electric charge obtained by subtracting the electric charge corresponding to the input current during the period t2 from the electric charge corresponding to the input current during the period t1. It should be noted that the limiting resolution of the counter COUNT1 is determined by $t\_clk \times I1$.

Further, the effect of disturbance DC light is addressed. Of the electric current Iin_1 that is generated by the photodiode PD1 during the period t1, Iled_1 is a current component constituted by infrared light from the detected object 10 and IdC_1 is a current component constituted by disturbance DC light. Further, of the electric current Iin_2 that is generated by the photodiode PD1 during the period t2, Iled_2 is a current component constituted by infrared light from the detected object 10 and IdC_2 is a current component constituted by disturbance DC light.

Since the duration of the period t1 and the duration of the period t2 are set equal to each other as mentioned above (t_1=t_2), IdC_1=Idc_2. Therefore, IdC_1=Idc_2=Idc. Further, during the period t2, Iled_2=0, as the LED 2 is not driven. Therefore,
Iin_1=Iled_1+Idc, and
Iin_2=Idc.
Substituting these values in Eq. (1) gives $$count = \{t\_1 \times (Iled\_1 + Idc) - t\_2 \times Idc\}/(t\_clk \times I1) = (t\_1 \times Iled\_1)/(t\_clk \times I1).$$

This equation shows that the component of disturbance DC light is canceled out and only the component of infrared light emitted from the LED 2 and reflected from the detected object 10 during the period t1 is extracted.

Further, since it is not necessary to convert the component of disturbance DC light into a digital value, the reference current I1 can be made smaller so that the counter COUNT1 can output a count value with high resolution. Furthermore, since there is no overlap between the periods t1 and t2, during which the input current flows, and the period in which the count value is counted, the periods t1 and t2 can be set as short periods equal to an integral multiple of the clock cycle. This makes it possible to lessen susceptibility to a change in disturbance DC light during the measuring time.

It should be noted that in the present embodiment, the charge and discharge cycle, which includes (i) charging the capacitor C1 during the first period and (ii) discharging the capacitor C1 during the second period, may be repeated more than once. Further, while, in the present embodiment, the digital conversion section 5a is configured to convert the amount of electric charge stored in the capacitor C1 into a digital value using a counter, the digital conversion section is not limited to this configuration. For example, the digital conversion section may be configured using a binary-tree search method or a parallel comparison method.

(Problems of Embodiment 2)

In the analog-digital conversion circuit ADC1a according to the present embodiment, an electric charge corresponding to a current component of disturbance DC light incident on the photodiode PD1 during the first period t1 needs to be stored in the capacitor C1. Therefore, in a case where the capacitance C_1 of the capacitor C1 is not set too high, there is a possibility that the voltage between the terminals T1 and T2 of the capacitor C1 during the periods t1 and t2 may not fall within the output dynamic range of the operational amplifier AMP1. Therefore, the capacitance C_1 needs to be set sufficiently high.

Meanwhile, in a case where the intensity of light reflected from the detected object 10 is low, the difference between the electric charge corresponding to the input current during the period t1 and the electric charge corresponding to the input current during the period t2 becomes smaller. Therefore, there is a possibility that at the end of the period t2, a potential difference sufficient for comparison in the comparison circuit 51 may not be generated between the terminals T1 and T2 of the capacitor C1 into which the difference has been put. This makes it necessary to use a high-precision comparator as the comparator CMP1, thus complicating the circuit configuration.

The following describes an embodiment of an analog-digital conversion circuit with two capacitors in view of the foregoing problems.

[Embodiment 3]

A third embodiment of the present invention is described with reference to FIGS. 10 through 15. The present embodiment describes a case where an analog-digital conversion circuit including two capacitors is applied to a proximity sensor. For convenience of explanation, members having the same functions as those described in Embodiment 2 above are given the same reference signs, as as such, are not described below.

(Configuration of a Proximity Sensor)

Figure 10:
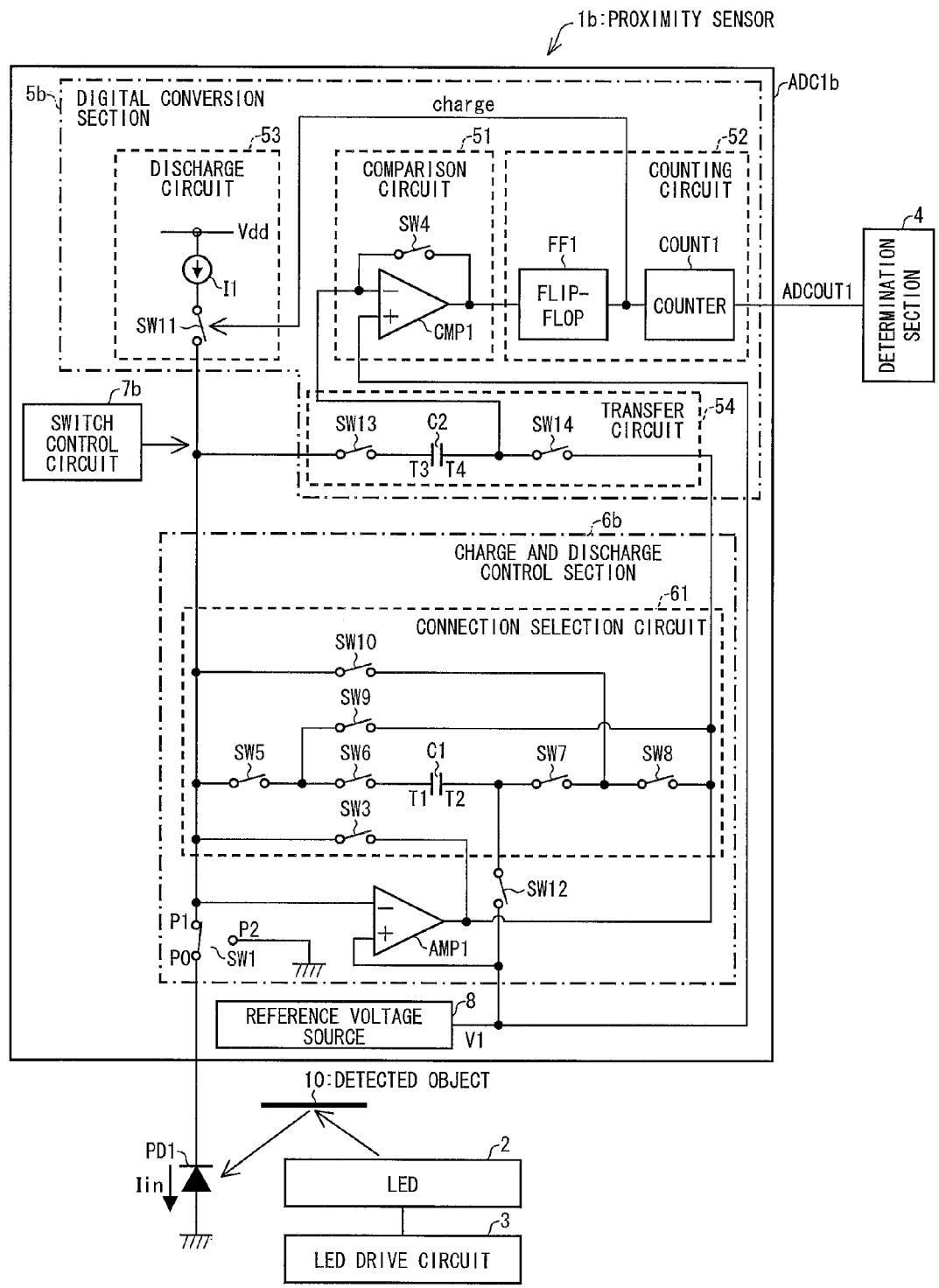
FIG. 10 is a diagram showing a configuration of a proximity sensor according to Embodiment 3 of the present invention.

FIG. 10 is a diagram showing a configuration of a proximity sensor 1b according to the present embodiment. The proximity sensor 1b is a specific example of a configuration of the proximity sensor shown in FIG. 1, and determines whether or not any detected object 10 is proximate. As shown in FIG. 10, the proximity sensor 1b includes a light-emitting diode (LED) 2, an LED drive circuit 3, a photodiode PD1, an analog-digital conversion circuit ADC1b, and a determination section 4. That is, the proximity sensor 1b is configured by replacing the analog-digital conversion circuit ADC1a with the analog-digital conversion circuit ADC1b in the proximity sensor 1a according to Embodiment 2 shown in FIG. 5.

(Configuration of the Analog-digital Conversion Circuit)

As shown in FIG. 10, the analog-digital conversion circuit ADC1b includes a capacitor C1, a capacitor (second capacitor) C2, a switch SW12, a digital conversion section 5b, a charge and discharge control section 6b, a switch control circuit 7b, and a reference voltage source 8. That is, the analog-digital conversion circuit ADC1b is configured by configuring the proximity sensor 1a according to Embodiment 2 to further include the capacitor C2 and replacing the switch SW2, the digital conversion section 5a, the charge and discharge control section 6a, and the switch control circuit 7 with the switch SW12, the digital conversion section 5b, the charge and discharge control section 6b, and the switch control circuit 7b, respectively, in the proximity sensor 1a according to Embodiment 2.

The digital conversion circuit 5b further includes the capacitor C2 and a transfer circuit 54 in addition to the comparison circuit 51, the counting circuit 52, and the discharge circuit 53.

The capacitor C2 includes terminals T3 and T4, and the capacitance of the capacitor C2 is lower than the capacitance of the capacitor C1. Therefore, in a case where the same amount of electric charge is stored in the capacitors C1 and C2, the voltage between the terminals T3 and T4 of the capacitor C2 becomes higher than the voltage between the terminals T1 and T2 of the capacitor C1. It should be noted that the terminals T3 and T4 of the capacitor C2 correspond to the first and second terminals of a second capacitor as set forth in the Claims, respectively.

The transfer circuit 54 has a function of transferring the electric charge stored in the capacitor C1 to the capacitor C2, and includes switches SW13 and SW14. One end of the switch SW13 is connected to the discharge circuit 53, one end of the switch SW10, one end of the switch SW5, one end of the switch SW1, the negative input terminal of the operational amplifier AMP1, and the node P1 of the switch SW1. The other end of the switch SW13 is connected to the terminal T3 of the capacitor C2. The terminal T4 of the capacitor C2 is connected to one end of the switch SW14 and the negative input terminal of the comparator CMP1 of the comparison circuit 51. The other end of the switch SW14 is connected to the other end of the switch SW9, the other end of the switch SW8, the other end of the switch SW3, and the output terminal of the operational amplifier AMP1.

The comparison circuit 51 compares the voltage at the terminal T4 of the capacitor C2 with the reference voltage V1. The counting circuit 52 counts the number of clocks of the clock signal during a period from a point in time where the comparator CMP1 determined that the voltage at the terminal T4 of the capacitor C2 is higher than the reference voltage V1 to a point in time where the comparator CMP1 determines that the voltage at the terminal T4 of the capacitor C2 is lower than the reference voltage V1. Further, the discharge circuit 53 uses the current source to cause the capacitor C2 to discharge at a predetermined speed while the comparator CMP1 determines that the voltage at the terminal T4 of the capacitor C2 is higher than the reference voltage V1.

While the comparison circuit 51 of the analog-digital conversion circuit ADC1a shown in FIG. 5 is connected to the terminal T2 of the capacitor C1 and the switch SW7 via the switch SW2, the comparison circuit 51 of the analog-digital conversion circuit ADC1b according to the present embodiment is connected to the terminal T4 of the capacitor C2 and the switch SW14.

The charge and discharge control section 6b includes a connection selection circuit 61, an operational amplifier AMP1, and a switch SW12. That is, the charge and discharge control section 6b is configured by replacing the switch SW2 with the switch SW12 in the charge and discharge control section 6b of the analog-digital conversion circuit ADC1a according to Embodiment 2.

One end of the switch SW12 is connected to a point of connection between the terminal T2 of the capacitor C1 and the switch SW7. The other end of the switch SW12 is connected to the positive input terminal of the operational amplifier AMP1, the positive input terminal of the comparator CMP1, and the reference voltage source 8.

As with the charge and discharge control section 6a, the charge and discharge control section 6b has a function of controlling charge and discharge of the capacitor C1. Specifically, the charge and discharge control section 6a puts, into the capacitor C1, an electric charge corresponding to an electric current inputted to the analog-digital conversion circuit ADC1b during the period t1 (first period), and causes an electric charge corresponding to an electric current inputted to the analog-digital conversion circuit ADC1b during the period t2 (second period) to be discharged from the capacitor C1. Therefore, an electric charge obtained by subtracting the electric charge corresponding to the electric current inputted during the period t2 from the electric charge corresponding to the electric current inputted during the period t1 is stored in the capacitor C1.

The switch control circuit 7b controls whether the switches SW1, SW3 to SW10, and SW12 to SW14 are on or off.

The other components of the proximity sensor 1b are identical to those of the proximity sensor 1a according to Embodiment 2, and as such, are not described here.

(Operation of the Proximity Sensor)

The following describes an operation of the proximity sensor 1b thus configured. The proximity sensor 1b switches its operation for each of the following periods: a preparatory period, a period t1, a period t2, a charge-transfer period, and an analog-digital conversion period. That is, as compared with those periods which define the operation of the proximity sensor 1a according Embodiment 2, the charge-transfer period is further added to those periods which define the operation of the proximity sensor 1b.

FIGS. 11 through 15 are diagrams for explaining the operations of the proximity sensor 1b during the preparatory period, the period t1 (first period), the period t2 (second period), the charge-transfer period, and the analog-digital conversion period, respectively. For convenience, FIGS. 11 through 15 omit to illustrate the switches and wires through which no electric currents flow when the switches are off.

(Preparatory Period)

The preparatory period precedes the period t1. In the preparatory period, an electric charge for cancelling out the effect of offset voltages of the operational amplifier AMP1 and of the comparator CMP1 is put into the capacitors C1 and C2 for the avoidance of an error in output value of the analog-digital conversion circuit ADC1b due to the offset voltages.

In the preparatory period, the switch control circuit 7b controls each of the switches shown in FIG. 10 so that the node P0 of the switch SW1 is connected to the node P1 of the switch SW1, that the switch SW3 is turned on, that the switch SW4 is turned on, that the switch SW5 is turned on, that the switch SW6 is turned on, that the switch SW7 is turned off, that the switch SW8 is turned off, that the switch SW9 is turned off, that the switch SW10 is turned off, that the switch SW12 is turned on, that the switch SW13 is turned on, that the switch SW14 is turned off, and that the switch SW11 is turned off. This places the proximity sensor 1b in a state shown in FIG. 11. During the preparatory period, the LED 2 is not driven.

Figure 11:
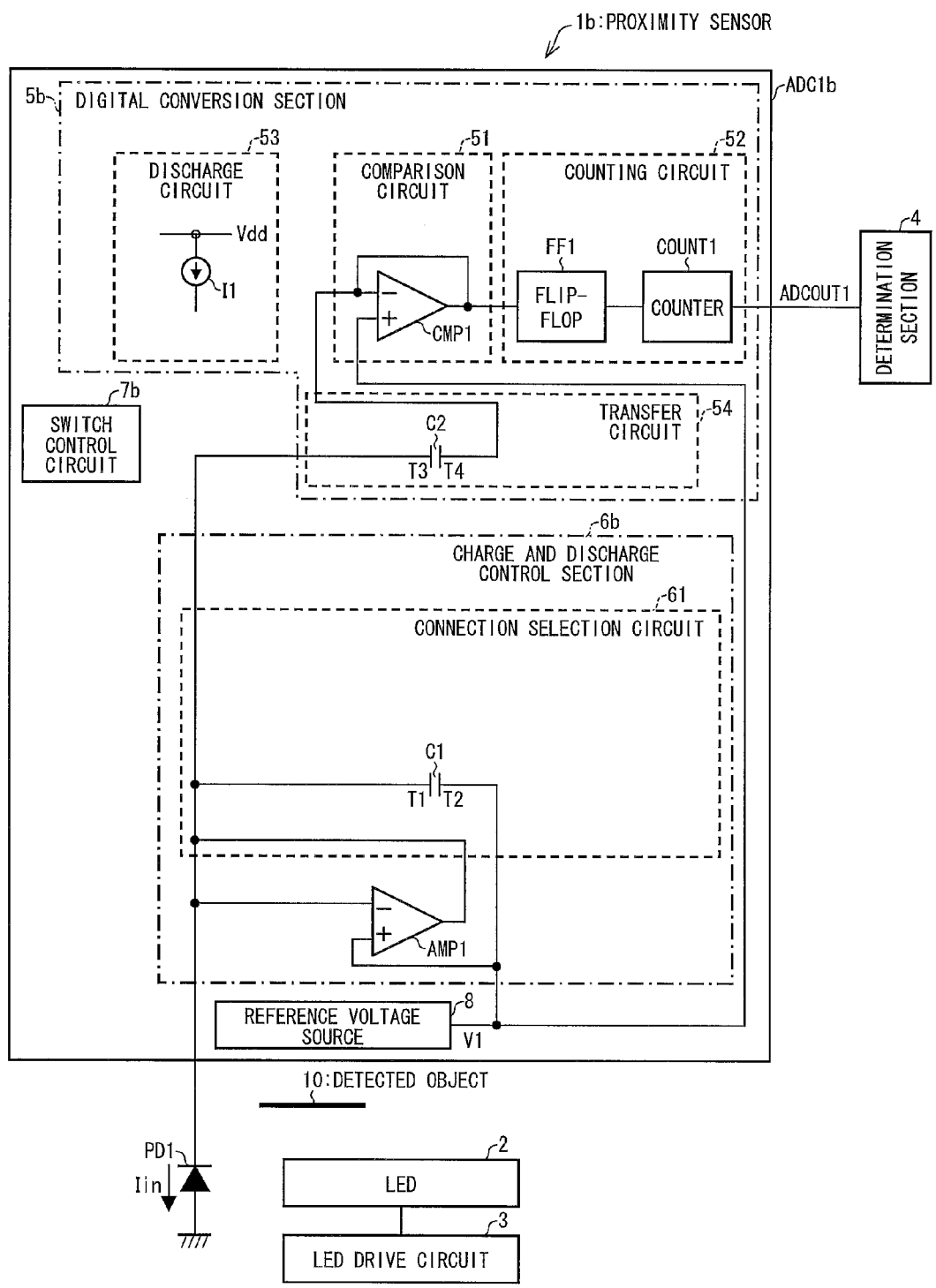
FIG. 11 is a diagram showing a state of the proximity sensor shown in FIG. 10 during a preparatory period.

In FIG. 11, the negative input terminal and output terminal of the operational amplifier AMP1 are both connected to the terminal T1 of the capacitor C1 and the terminal T3 of the capacitor C2, so that the negative input terminal and output terminal of the comparator CMP1 get short-circuited. This causes an electric charge corresponding to the offset voltage of the operational amplifier AMP1 to be put into the capacitor C1, and causes an electric charge corresponding to the difference between the offset voltage of the operational amplifier AMP1 and the offset voltage of the comparator CMP1 to be put into the capacitor C2.

Specifically, assuming that Vamp is the offset voltage of the operational amplifier AMP1, an imaginary short circuit between the positive input terminal and negative input terminal of the operational amplifier AMP1 is caused by a short circuit caused between the output terminal and negative input terminal of the operational amplifier AMP1. Since the voltage at the positive input terminal of the operational amplifier AMP1 is the reference voltage V1 from the reference voltage source 8, the voltage at the negative input terminal of the operational amplifier AMP1 is V1+Vamp. Therefore, the voltage at the terminal T1 of the capacitor C1 is V1+Vamp, and the voltage at the terminal T2 of the capacitor C1 is −C1×Vamp.

Meanwhile, assuming that Vcmp is the offset voltage of the comparator CMP1, an imaginary short circuit between the positive input terminal and negative input terminal of the comparator CMP1 is caused by a short circuit caused between the output terminal and negative input terminal of the comparator CMP1. This causes the voltage at the positive input terminal of the comparator CMP1 to be V1 and causes the voltage at the negative input terminal of the comparator CMP1 to be V1+Vcmp.

Since the voltage at the terminal T3 of the capacitor C2 is V1+Vamp, an electric charge of +C2×(Vamp−Vcmp) is put into the capacitor C2 via the terminal T3, and an electric charge of −C2×(Vamp−Vcmp) is put into the capacitor C2 via the terminal T4.

Since charge of such values is stored in the capacitor C2, the digital conversion section 5b can accurately convert the difference between an electric charge corresponding to an input current during the first period and an electric charge corresponding to an input current during the second period into a digital value even in a case where there are offset voltages at the operational amplifier AMP1 and the comparator CMP1 as will be described later.

Although the LED 2 emits no light during the preparatory period, an input current from the photodiode PD1 by disturbance DC light flows through the charge and discharge control section 6b, as the disturbance DC light is incident on the photodiode PD1. However, this input current flows from the output terminal of the operational amplifier AMP1 toward the photodiode PD1, and as such, is not put into the capacitors C1 and C2.

Further, in the absence of offset voltages at the operational amplifier AMP1 and the comparator CMP1, no electric charge is stored in the capacitors C1 and C2 at the end of the preparatory period. That is, the potential difference between the terminals T1 and T2 of the capacitor C1 and the potential difference between the terminals T3 and T4 of the capacitor C2 are 0 V at the end of the preparatory period.

(First Period)

During the period t1 (first period) that follows the preparatory period, the switches are controlled so that an electric charge corresponding to an electric current generated by the photodiode PD1 is put into the capacitor C1. Specifically, the switch control circuit 7b controls each of the switches shown in FIG. 10 so that the node P0 of the switch SW1 is connected to the node P1 of the switch SW1, that the switch SW3 is turned off, that the switch SW4 is turned on, that the switch SW5 is turned on, that the switch SW6 is turned on, that the switch SW7 is turned on, that the switch SW8 is turned on, that the switch SW9 is turned off, that the switch SW10 is turned off, that the switch SW12 is turned off, that the switch SW13 is turned off, that the switch SW14 is turned off, and that the switch SW11 is turned off. This places the proximity sensor 1b in a state shown in FIG. 12.

Further, during the period t1, the LED drive circuit 3 drives the LED 2. In a case where the detected object 10 is proximate, infrared light emitted from the LED 2 and reflected by the detected object 10 is incident on the photodiode PD1, together with disturbance DC light. Accordingly, the photodiode PD1 generates an electric current corresponding to the combined intensity of disturbance DC light and infrared light.

Figure 12:
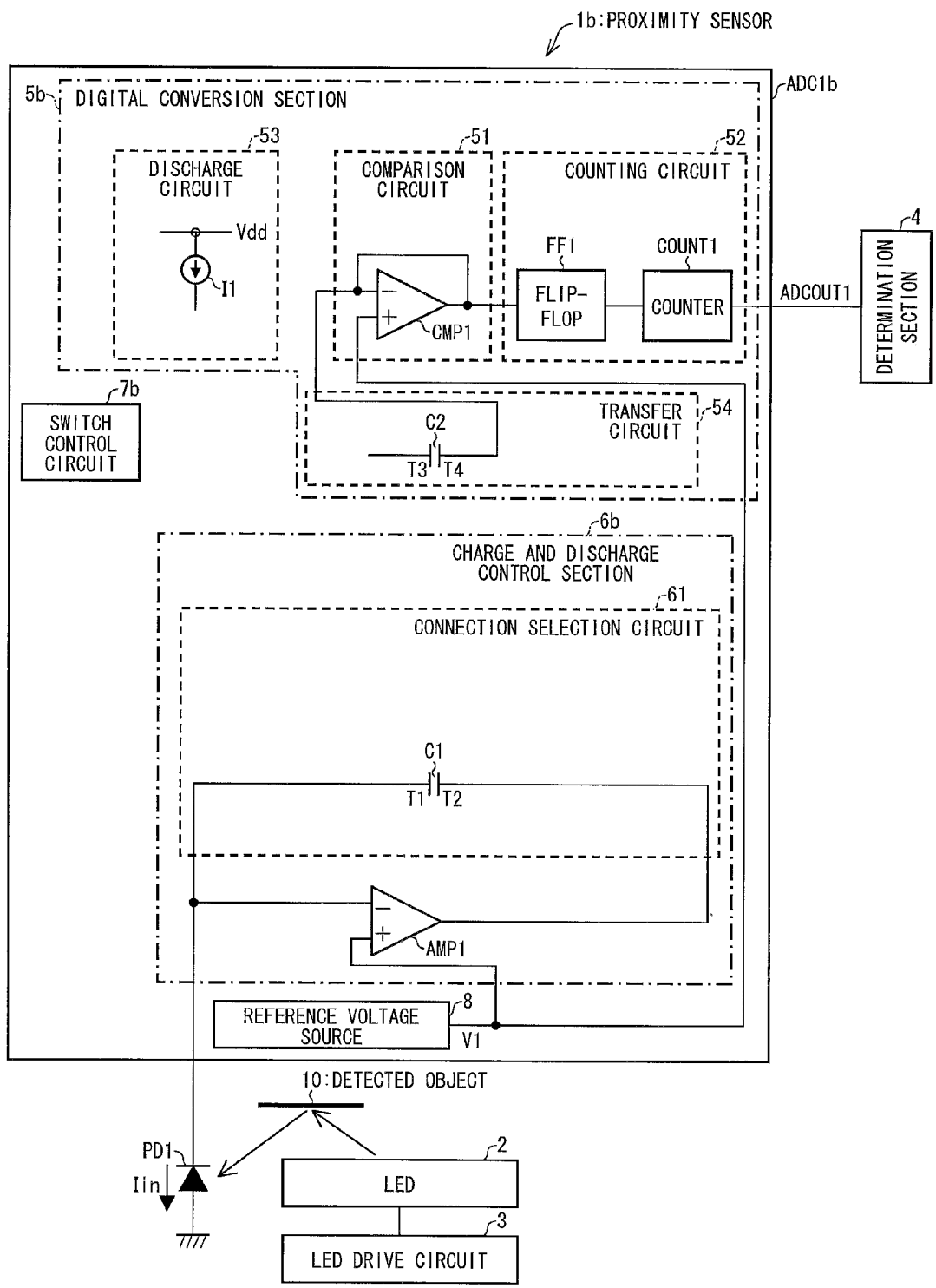
FIG. 12 is a diagram showing a state of the proximity sensor shown in FIG. 10 during a first period.

In FIG. 12, the connection selection circuit 61 selects the first state of connection in which the negative input terminal and output terminal of the operational amplifier AMP1 are connected to the terminals T1 and T2 of the capacitor C1, respectively. That is, the negative input terminal and output terminal of the operational amplifier AMP1 are connected to each other via the capacitor C1, and there is an imaginary short circuit between the positive input terminal and negative input terminal of the operational amplifier AMP1. This causes the cathode voltage of the photodiode PD1 to be fixed at the voltage V1+Vamp at the terminal T1 of the capacitor C1 during the preparatory period.

Further, the photodiode PD1 is connected solely to the terminal T1 of the capacitor C1 and the negative input terminal of the operational amplifier AMP1. Therefore, assuming that t_1 is the duration of the period t1 and Iin_1 is the electric current generated by the photodiode PD1, an electric charge ($t\_1 \times Iin\_1$) corresponding to the electric current $Iin\_1$ that flows for the duration $t\_1$ flows out of the capacitor C1 via the terminal T1. This causes the terminal T1 of the capacitor C1 to carry an electric charge of $-t\_1 \times Iin\_1 + C\_1 \times Vamp$, including the electric charge that was put into the capacitor C1 during the preparatory period.

Meanwhile, the electric charge supply from the output terminal of the operational amplifier AMP1 causes the terminal T2 of the capacitor C1 to carry an electric charge of $+t\_1 \times Iin\_1 - C\_1 \times Vamp$, which is equal in absolute quantity and opposite in sign to the electric charge at the terminal T1 of the capacitor C1.

It should be noted that the voltage at the terminal T2 of the capacitor C1 is as follows:

$$V1 + Vamp + (+t\_1 \times Iin\_1 - C1 \times Vamp)/C\_1 = V1 + (+t\_1 \times Iin\_1)/C\_1.$$

The capacitance $C\_1$ of the capacitor C1 is set so that this voltage falls short of the output dynamic range of the operational amplifier AMP1.

Since the capacitor C2 has its terminal T3 open during the period t1, there occurs no charge transfer in the capacitor C2. Therefore, an electric charge of $+C2 \times (Vamp - Vcmp)$ is put into the capacitor C2 via the terminal T3, and an electric charge of $(Vamp - Vcmp)$ is retained at the terminal T4 of the capacitor C2.

(Second Period)

During the period t2 (second period) that follows the period t1, the switches are controlled so that the electric charge corresponding to the electric current generated by the photodiode PD1 is discharged from the capacitor C1. Specifically, the switch control circuit 7b controls each of the switches shown in FIG. 10 so that the node P0 of the switch SW1 is connected to the node P1 of the switch SW1, that the switch SW3 is turned off, that the switch SW4 is turned on, that the switch SW5 is turned off, that the switch SW6 is turned on, that the switch SW7 is turned on, that the switch SW8 is turned off, that the switch SW9 is turned on, that the switch SW10 is turned on, that the switch SW12 is turned off, that the switch SW13 is turned off, that the switch SW14 is turned off, and that the switch SW11 is turned off. This places the proximity sensor 1b in a state shown in FIG. 13.

During the period t2, the LED 2 is not driven. Therefore, only disturbance DC light is incident on the photodiode PD1, and the photodiode PD1 generates an electric current corresponding to the intensity of disturbance DC light. Further, the duration $t\_2$ of the period t2 is set to be equal to the duration $t\_1$ of the period t1.

Figure 13:
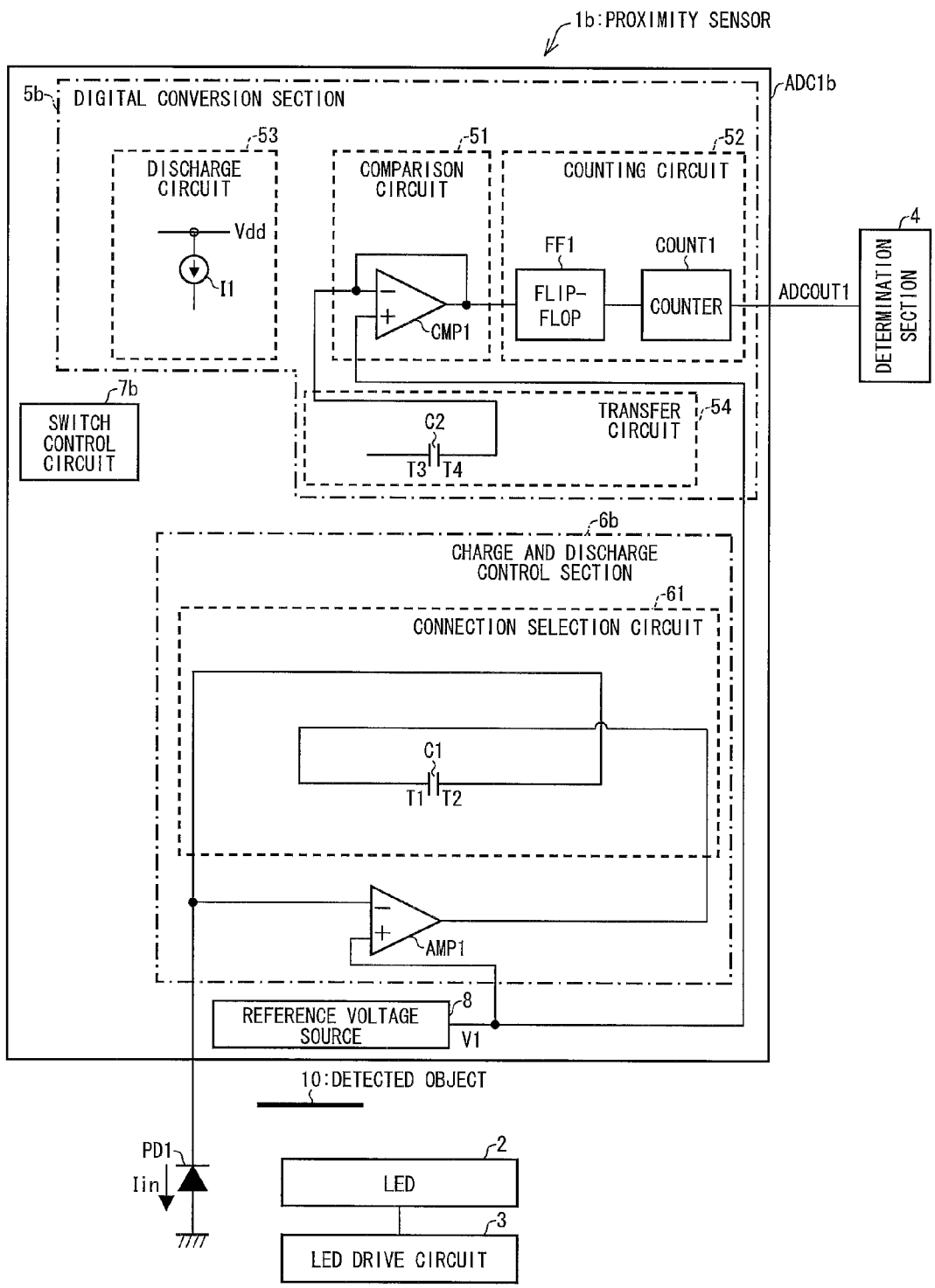
FIG. 13 is a diagram showing a state of the proximity sensor shown in FIG. 10 during a second period.

In FIG. 13, the connection selection circuit 61 selects the second state of connection in which the negative input terminal and output terminal of the operational amplifier AMP1 are connected to the terminals T2 and T1 of the capacitor C1, respectively. That is, the output terminal and negative input terminal of the operational amplifier AMP1 are connected to each other via the capacitor C1, and there is an imaginary short circuit between the positive input terminal and negative input terminal of the operational amplifier AMP1. This causes the cathode voltage of the photodiode PD1 to be fixed at the voltage $V1 + Vamp$ at the terminal T1 of the capacitor C1 during the preparatory period and the period t1.

Further, the photodiode PD1 is connected solely to the terminal T2 of the capacitor C1 and the negative input terminal of the operational amplifier AMP1. Therefore, assuming that $Iin\_2$ is the electric current generated by the photodiode PD1, an electric charge ($t\_2 \times Iin\_2$) corresponding to the electric current $Iin\_2$ that flows for the duration $t\_2$ flows out of the capacitor C1 via the terminal T2. This causes the terminal T2 of the capacitor C1 to carry an electric charge of $(-t\_2 \times Iin\_2 + t\_1 \times Iin\_1 - C1 \times Vamp)$, excluding an electric charge of $t\_2 \times Iin\_2$ from the electric charge that was stored at the end of the period t1.

Meanwhile, the electric charge supply from the output terminal of the operational amplifier AMP1 causes the terminal T1 of the capacitor C1 to carry an electric charge of $(+t\_2 \times Iin\_2 - t\_1 \times Iin\_1 + C1 \times Vamp)$, which is equal in absolute quantity and opposite in sign to the electric charge at the terminal T2 of the capacitor C1.

Since the capacitor C2 has its terminal T3 open during the period t2, too, there occurs no charge transfer in the capacitor C2. Therefore, an electric charge of $+C2 \times (Vamp - Vcmp)$ is put into the capacitor C2 via the terminal T3, and an electric charge of $-C2 \times (Vamp - Vcmp)$ is retained at the terminal T4 of the capacitor C2.

(Charge-transfer Period)

During the charge-transfer period that follows the period t2, the switches are controlled so that the electric charge stored in the capacitor C1 at the end of the period t2 is transferred to the capacitor C2. Specifically, the switch control circuit 7b controls each of the switches shown in FIG. 10 so that the node P0 of the switch SW1 is connected to the node P2 of the switch SW1, that the switch SW3 is turned off, that the switch SW4 is turned off, that the switch SW5 is turned on, that the switch SW6 is turned on, that the switch SW7 is turned off, that the switch SW8 is turned on, that the switch SW9 is turned off, that the switch SW10 is turned off, that the switch SW12 is turned on, that the switch SW13 is turned on, that the switch SW14 is turned on, and that the switch SW11 is turned off. This places the proximity sensor 1b in a state shown in FIG. 14.

During the charge-transfer period, the LED 2 is not driven. Therefore, only disturbance DC light is incident on the photodiode PD1, and the photodiode PD1 generates an electric current corresponding to the intensity of disturbance DC light. However, since the photodiode PD1 has its cathode connected to GND, the disturbance DC light does not affect the operation of charge transfer.

In FIG. 14, the terminal T1 of the capacitor C1 and the terminal T3 of the capacitor C2 are connected to each other. The output terminal and negative input terminal of the operational amplifier AMP1 are connected to each other via the capacitor C2, and there is an imaginary short circuit between the positive input terminal and negative input terminal of the operational amplifier AMP1. Therefore, the voltage at the terminal T1 of the capacitor C1 is $V1 + Vamp$. Since the voltage at the terminal T2 of the capacitor C1 is the reference voltage V1 from the reference voltage source 8, an electric charge of $+C1 \times Vamp$ is put into the capacitor C1 via the terminal T1 and an electric charge of $-C1 \times Vamp$ is put into the capacitor C1 via the terminal T2.

At the end of the period t2 (i.e. at the start of the charge-transfer period), an electric charge of $(+t\_2 \times Iin\_2 - t\_1 \times Iin\_1 + C1 \times Vamp)$ is stored at the terminal T1 of the capacitor C1. Therefore, the following electric charge, which is an electric charge obtained by subtracting, from the above electric charge, an electric charge that is put into the capacitor C1 via the terminal T1 during the charge-transfer period, is transferred to the capacitor C2 via the terminal T3:

$$+t\_2 \times Iin\_2 - t\_1 \times Iin\_1 + C1 \times Vamp - C1 \times Vamp = +t\_2 \times Iin\_2 - t\_1 \times Iin\_1.$$

It should be noted here that the electric charge of $+C1 \times Vamp$ was already put into the capacitor C1 via the terminal T1 during the preparatory period. For this reason, even in a case where there is an offset voltage at the operational amplifier AMP1, only an electric charge (+t_2×Iin_2−t_1×Iin_1), obtained by subtracting the electric charge corresponding to the electric current inputted during the period t2 from the electric charge corresponding to the electric current inputted during the period t1, is transferred to the capacitor C2 via the terminal T3.

Further, since the electric charge of +C2×(Vamp−Vcmp) had been put into the capacitor C2 via the capacitor C1 at the end of the second period, the addition of the charge transferred from the capacitor C1 causes the terminal T3 of the capacitor C2 to carry an electric charge of +t_2×Iin_2−t_1×Iin_1+C2×(Vamp−Vcmp) at the end of the charge-transfer period.

Meanwhile, the electric charge supply from the output terminal of the operational amplifier AMP1 causes the terminal T4 of the capacitor C2 to carry an electric charge of −t_2×Iin_2+t_1×Iin_1−C2×(Vamp−Vcmp), which is equal in absolute quantity and opposite in sign to the electric charge at the terminal T3.

The following discusses the voltage at the terminal T4 of the capacitor C2 at the end of the charge-transfer period. During the charge-transfer period, the output terminal and negative input terminal of the operational amplifier AMP1 are connected to each other via the capacitor C2, and there is an imaginary short circuit between the positive input terminal and negative input terminal of the operational amplifier AMP1. Therefore, the potential at the terminal T3 of the capacitor C2 is V1+Vamp. Further, since the voltage at the terminal T4 of the capacitor C2 is higher than the voltage at the terminal T3 of the capacitor C2 by {−t_2×Iin_2+t_1×Iin_1−C_2×(Vamp−Vcmp)}/C_2, the voltage at the terminal T4 of the capacitor C2 is V1+Vamp+{−t_2×Iin_2+t_1×Iin_1−C_2×(Vamp−Vcmp)}/C_2=V1+Vcmp+(−t_2×Iin_2+t_1×Iin_1)/C_2. The capacitance C_2 of the capacitor C2 is set so that this voltage falls short of the output dynamic range of the operational amplifier AMP1 and falls short of the input dynamic range of the comparator CMP1.

It should be noted here that the capacitance C_2 of the capacitor C2 is set lower than the capacitance C_1 of the capacitor C1. This causes the voltage between the terminals T3 and T4 of the capacitor C2 to be higher than the voltage between the terminals T1 and T2 of the capacitor C1 at the start of the charge-transfer period. Therefore, even in a case where an electric charge obtained by subtracting an electric charge corresponding to an electric current inputted during the period t2 from an electric charge corresponding to an electric current inputted during the period t1 is small, a potential difference sufficient for comparison in the comparator CMP1 is generated between the terminals T3 and T4 of the capacitor C2. This eliminates the need to use a high-precision comparator as the comparator CMP1 and therefore further simplify the circuit configuration of the analog-digital conversion circuit ADC1b.

(Analog-digital Conversion Period)

During the analog-digital conversion period that follows the charge-transfer period, the switches are controlled so that the electric charge stored in the capacitor C2 at the end of the charge-transfer period is converted into a digital value ADCOUT1 by the digital conversion section 5b. Specifically, the switch control circuit 7b controls each of the switches shown in FIG. 10 so that the node P0 of the switch SW1 is connected to the node P2 of the switch SW1, that the switch SW3 is turned off, that the switch SW4 is turned off, that the switch SW5 is turned on, that the switch SW6 is turned off, that the switch SW7 is turned off, that the switch SW8 is turned on, that the switch SW9 is turned off, that the switch SW10 is turned off, that the switch SW12 is turned on, that the switch SW13 is turned on, and that the switch SW14 is turned on. Further, the switch SW11 is turned on only during a period in which the discharge control signal charge is low. This places the proximity sensor 1b in a state shown in FIG. 15.

During the analog-digital conversion period, as with the charge-transfer period, the LED 2 is not driven. Therefore, only disturbance DC light is incident on the photodiode PD1, and the photodiode PD1 generates an electric current corresponding to the intensity of disturbance DC light. However, since the photodiode PD1 has its cathode connected to GND, the disturbance DC light does not affect the operation of analog-digital conversion.

Figure 15:
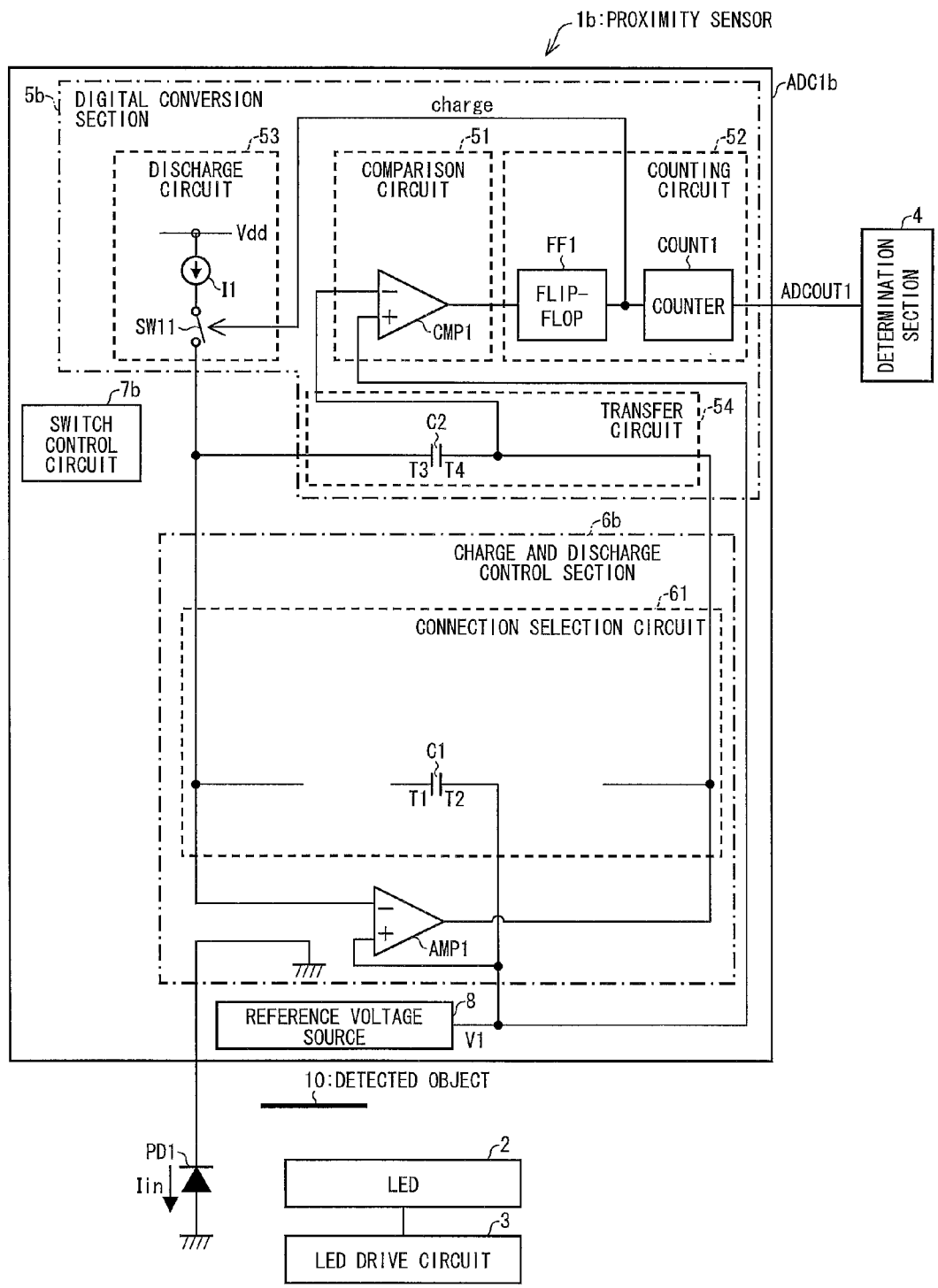
FIG. 15 is a diagram showing a state of the proximity sensor shown in FIG. 10 during an analog-digital conversion period.
Figure 16:
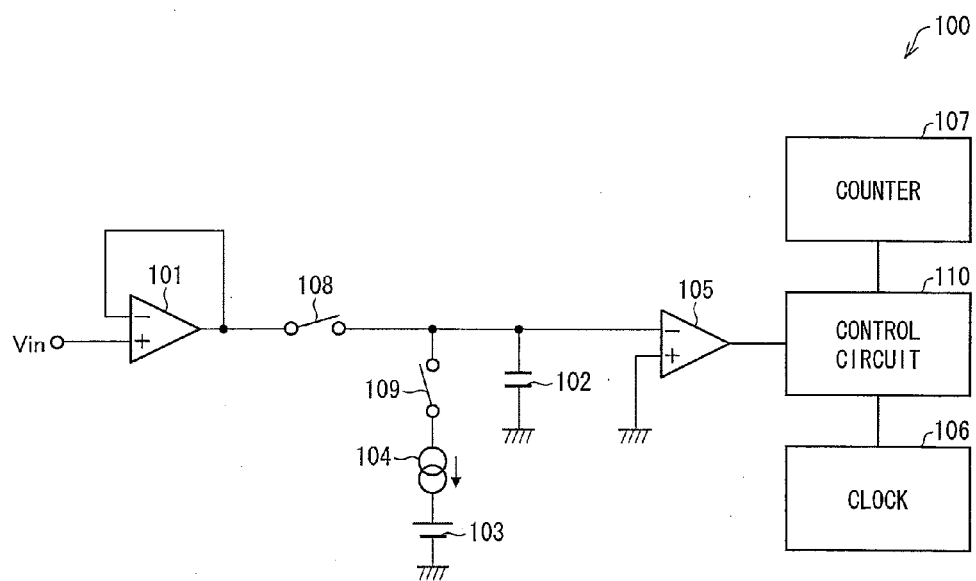
FIG. 16 is a circuit diagram showing a configuration of a conventional analog-digital conversion circuit.
Figure 17:
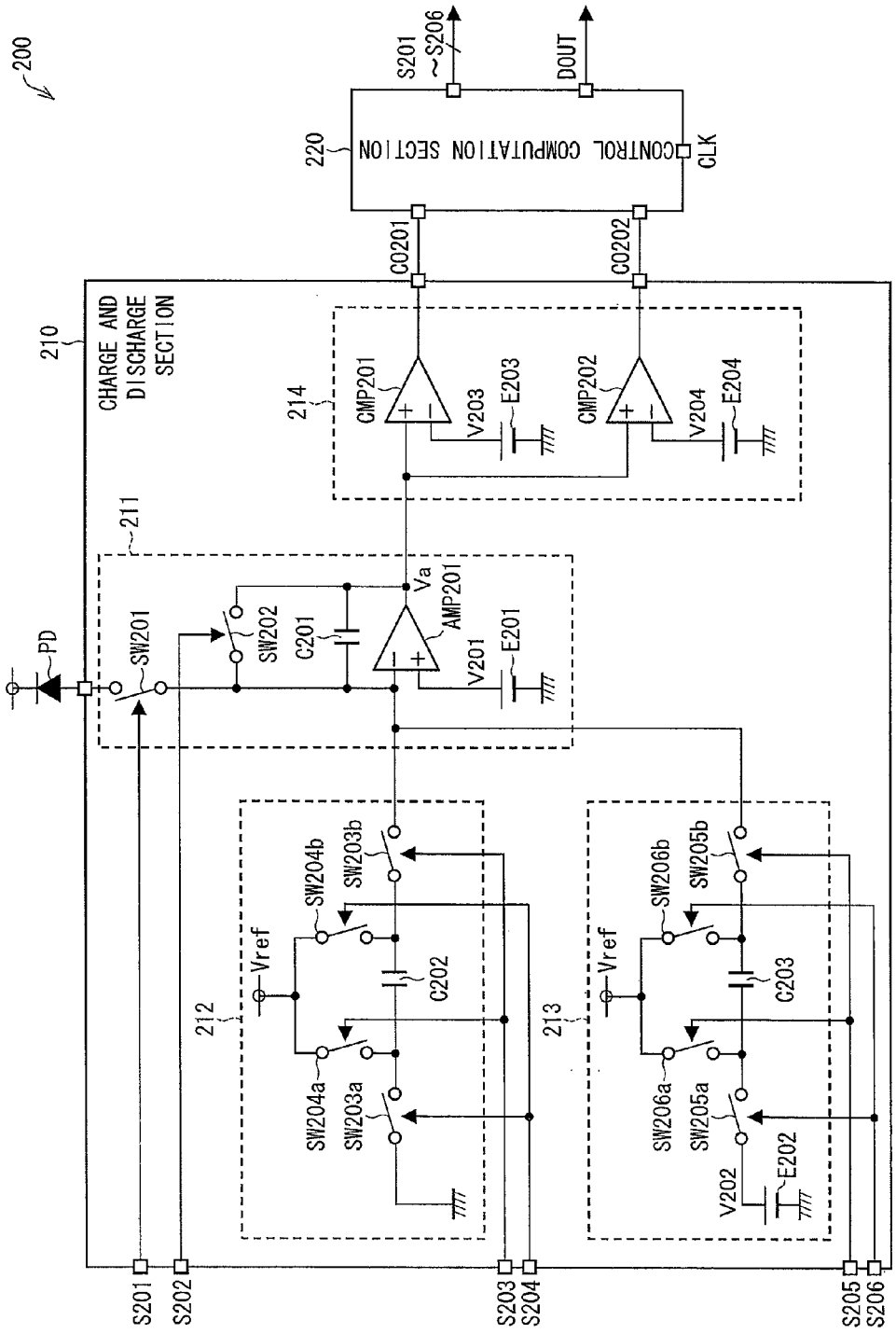
FIG. 17 is a circuit diagram showing a configuration of a conventional illuminance sensor.

As shown in FIG. 15, the terminal T1 of the capacitor C1 from which the charge has been transferred is made open. Further, since the terminal T3 of the capacitor C2 is connected to the discharge circuit 53, the flow of the reference current I1 from the discharge circuit 53 causes the electric charge carried by the terminal T3 of the capacitor C2 to be discharged, with the result that the voltage at the terminal T4 of the capacitor C2 drops.

At the end of the charge-transfer period, the voltage at the terminal T4 of the capacitor C2 is V1+Vcmp+(−t_2×Iin_2+t_1×Iin_1)/C_2. This voltage is applied to the negative input terminal of the comparator CMP1, and the voltage V1 from the reference voltage source 8 is applied to the positive input terminal of the comparator CMP1. Since the voltage at the negative input terminal of the comparator CMP1 is higher than the voltage at the positive input terminal of the comparator CMP1, the comparator CMP1 outputs a low signal. During the period in which the output signal from the comparator CMP1 is low, the discharge control signal charge is low and therefore the switch SW11 is turned on. The discharge circuit 53 causes the reference current I1 to flow at the timing when the switch SW11 is on and discharges the electric charge carried by the terminal T3 of the capacitor C2. This causes the the voltage at the terminal T4 of the capacitor C2 to drop.

After that, the output from the comparator CMP1 switches from low to high when the voltage at the negative input terminal of the comparator CMP1 (i.e. the voltage at the terminal T4 of the capacitor C2) becomes lower than V1+Vcmp. This causes the discharge control signal charge to be high, and the switch SW11 is turned off.

The counting circuit 52 is controlled by clocks. The counter COUNT1 counts the number of clocks during a period from a point in time where the output from the comparator CMP1 became low to a point in time where the output from the comparator CMP1 switches to high, and outputs the resulting count value as a digital value ADCOUT1 to the determination section 4. The determination section 4 compares the digital value ADCOUT1 with a predetermined threshold value, and determines, on the basis of a result of the comparison, whether or not the detected object 10 is proximate to the proximity sensor 1b.

The following discusses the amount of electric charge that is discharged by the reference current I1 during a period from a point in time where the voltage at the negative input terminal of the comparator CMP1 (i.e. the voltage at the terminal T4 of the capacitor C2) started to become lower to a point in time where the potential difference between the negative input terminal and the positive input terminal becomes Vcmp (i.e. the voltage at the negative input terminal becomes V1+Vcmp). The electric charge carried by the terminal T3 of the capacitor C2 at the point in time where the voltage at the negative input terminal of the comparator CMP1 becomes V1+Vcmp is +C_2×(Vamp−Vcmp). On the other hand, the electric charge at the terminal T3 of the capacitor C2 at the start of the analog-digital conversion period is $+t\_2 \times Iin\_2 - t\_1 \times Iin\_1 + C\_2 \times (Vamp - Vcmp)$. Therefore, the electric charge that is discharged from the capacitor C2 via the terminal T3 by the reference current I1 is as follows:

$$\{+t\_2 \times Iin\_2 - t\_1 \times Iin\_1 + C\_2 \times (Vamp - Vcmp)\} - C\_2 \times (Vamp - Vcmp) = +t2 \times Iin\_2 - t1 \times Iin\_1.$$

Note here that the electric charge that was carried by the terminal T3 of the capacitor C2 at the end of the preparatory period is of $+C\_2 \times (Vamp - Vcmp)$. Therefore, even in a case where offset voltages occur in the operational amplifier AMP1 and the comparator CMP1, the only electric charge that is discharged by the reference current I1 is $(+t\_2 \times Iin\_2 - t\_1 \times Iin\_1)$, which is obtained by subtracting the electric charge corresponding to the input current during the period t2 from the electric charge corresponding to the input current during the period t1.

Assuming that t_clk is a single cycle of clock that is inputted to the counter COUNT1 and count is the value obtained by the counter COUNT1 counting discharge time, (Charge That Is Charged into Capacitor C2 via Terminal T3)+(Charge That Is Discharged out of Capacitor C2 via Terminal T3)=0; therefore, Eq. (2) holds as follows:

$$t\_clk \times count \times I1 + (+t\_2 \times Iin\_2 - t\_1 \times Iin\_1) = 0 \quad count = (t\_1 \times Iin\_1 - t\_2 \times Iin\_2)/(t\_clk \times I1) \quad \text{Eq. (2)}.$$

That is, the count value shown by Eq. (2) is equal to the count value of the counter COUNT1 shown by Eq. (1) above in Embodiment 2, and corresponds to the electric charge obtained by subtracting the electric charge corresponding to the input current during the period t2 from the electric charge corresponding to the input current during the period t1.

As for the influence exerted by disturbance DC light, Eq. (2) is equal to Eq. (1). Therefore, as in Embodiment 2 described above, the counter value of the counter COUNT1 corresponds solely to a component of infrared light emitted from the LED 2 and reflected from the detected object 10 during the period t1.

Further, since it is not necessary to convert the component of disturbance DC light into a digital value, the reference current I1 can be made smaller so that the counter COUNT1 can output a count value with high resolution. Furthermore, since there is no overlap between the periods t1 and t2, during which the input current flows, and the period in which the count value is counted, the periods t1 and t2 can be set as short periods equal to an integral multiple of the clock cycle. This makes it possible to lessen susceptibility to a change in disturbance DC light during the measuring time.

It should be noted that in the present embodiment, the charge and discharge cycle, which includes (i) charging the capacitor C1 during the first period and (ii) discharging the capacitor C1 during the second period, may be repeated more than once.

(Comparison with Embodiment 2)

The present embodiment differs from Embodiment 2 in that the analog-digital conversion circuit ADC1*b* further includes the capacitor C2 and the charge-transfer period, in which an electric charge is transferred from the capacitor C1 to the capacitor C2, is provided. As explained in (Problems of Embodiment 2), since the capacitance C_1 of the capacitor C1 needs to be set sufficiently high, the analog-digital conversion circuit ADC1*b* according to Embodiment 2 has such a problem that in a case where the electric charge obtained by subtracting the electric charge corresponding to the input current during the period t2 from the electric charge corresponding to the input current during the period t1 is small, a potential difference sufficient for comparison in the comparison circuit 51 may not be generated between the terminals T1 and T2 of the capacitor C1.

In order to solve this problem, the present embodiment provides the capacitor C2 whose capacitance is lower than the capacitance C_1 and performs analog-digital conversion after transferring the charge from the capacitor C1 to the capacitor C2 during the charge-transfer period. Therefore, even in a case where the electric charge obtained by subtracting the electric charge corresponding to the input current during the period t2 from the electric charge corresponding to the input current during the period t1 is small, a potential difference sufficient for comparison in the comparison circuit 51 is generated between the terminals T3 and T4 of the capacitor C2. This eliminates the need to use a high-precision comparator as the comparator CMP1 and therefore makes the circuit configuration of the analog-digital conversion circuit ADC1*b* simpler than that of the analog-digital conversion circuit ADC1*a*.

The durations of the period t1, the period t2, the charge-transfer period, and the analog-digital conversion period are about 6 μs, 6 μs, 40 μs, and 400 μs, respectively. Therefore, the percentage of the charge-transfer period to the total is small. Therefore, the speed of operation of the analog-digital conversion circuit ADC1*b* does not become much lower than the speed of operation of the analog-digital conversion circuit ADC1*a*.

Further, in a case where the charge and discharge cycle during the periods t1 and t2 is repeated more than once, the percentage of the charge-transfer period to the total becomes much smaller. Similarly, in a case where the maximum value of the number of clocks that are counted by the counter COUNT1 is set high (e.g. $2^{10}=1024$ clocks), the analog-digital conversion period becomes longer, so that the percentage of the charge-transfer period to the total becomes much smaller. Therefore, it can be said that the speed of operation of the analog-digital conversion circuit ADC1*b* is about the same as the speed of operation of the analog-digital conversion circuit ADC1*a*.

[Summary]

In order to solve the foregoing problems, an analog-digital conversion circuit according to an aspect of the present invention includes: a first capacitor (capacitor C1); a digital conversion section that converts an amount of electric charge stored in the first capacitor into a digital signal; and a charge and discharge control section that controls charge and discharge of the first capacitor, the charge and discharge control section putting, into the first capacitor, an electric charge corresponding to an electric current inputted to the analog-digital conversion circuit during a first period, the charge and discharge control section causing an electric charge corresponding to an electric current inputted to the analog-digital conversion circuit during a second period that follows the first period to be discharged from the first capacitor, during an analog-digital conversion period that comes after the end of the charge and discharge control carried out by the charge and discharge control section, the digital conversion section converting an amount of electric charge stored in the first capacitor at the end of the charge and discharge control into a digital signal (digital value ADCOUT1).

According to the foregoing configuration, an electric charge obtained by subtracting the electric charge corresponding to the electric current inputted during the second period from the electric charge corresponding to the electric current inputted during the first period is stored in the first capacitor at the end of the charge and discharge control carried out by the charge and discharge control section, and the amount of electric charge thus stored is converted into a digital signal by the digital conversion section. That is, the analog-digital conversion circuit can obtain the difference between a digital signal corresponding to the electric current (electric current Iin1) inputted during the first period and a digital signal corresponding to the electric current (electric current Iin2) inputted during the second period, without converting the electric current Iin1 and the electric current Iin2 into digital signals. This makes it possible to set the resolution of the digital conversion section with respect to the difference between a digital value corresponding to the electric current Iin1 and a digital value corresponding to the electric current Iin2, regardless of the magnitude of each of the electric currents Iin1 and Iin2. This in turn makes it possible to set the resolution of the digital conversion section high even when the electric currents Iin1 and Iin2 contain intense DC components. Therefore, the analog-digital conversion circuit can highly accurately convert the difference between electric currents inputted during different periods into a digital signal with a simple configuration.

Furthermore, the analog-digital conversion circuit according to an aspect of the present invention may be configured such that the charge and discharge control section performs more than once a charge and discharge cycle including (i) charging the first capacitor during the first period and (ii) discharging the first capacitor during the second period.

According to the foregoing configuration, an electric charge obtained by subtracting the electric charge corresponding to the electric current inputted during the second period from the electric charge corresponding to the electric current inputted during the first period is integrally stored in the first capacitor for each charge and discharge cycle. Therefore, more charge can be stored in the first capacitor than in a case where the first capacitor is charged and discharged only once. This makes it possible to further improve conversion accuracy.

Furthermore, the analog-digital conversion circuit according to an aspect of the present invention may be configured such that: the digital conversion section includes (i) a second capacitor having a capacitance that is lower than the capacitance of the first capacitor and (ii) a transfer section that transfers the electric charge stored in the first capacitor to the second capacitor during a charge-transfer period that comes after the end of the charge and discharge control carried out by the charge and discharge control section and that comes before the start of the analog-digital conversion period; and the digital conversion section converts an amount of electric charge stored in the second capacitor at the end of the transfer of the electric charge by the transfer section into a digital signal.

According to the foregoing configuration, since the capacitance of the second capacitor is lower than the capacitance of the first capacitor, the voltage between the terminals of the second capacitor at the end of the charge-transfer period is high than the voltage between the terminals of the first capacitor at the start of the charge-transfer period. Therefore, in a case where the digital conversion section includes a comparator that compares the voltage at one terminal of the second capacitor with the reference voltage and is configured to digitally convert the amount of electric charge stored in the second capacitor on the basis of the voltage, a potential difference sufficient for comparison in the comparator is generated between the terminals of the second capacitor, even in a case where an electric charge obtained by subtracting an electric charge corresponding to the electric current Iin2 from an electric charge corresponding to the electric current Iin1. This eliminates the need to use a high-precision comparator as the aforementioned comparator and therefore further simplify the circuit configuration of the analog-digital conversion circuit.

Furthermore, the analog-digital conversion circuit according to an aspect of the present invention may be configured such that: the charge and discharge control section includes (i) an operational amplifier, (ii) a first switch that changes between being turned on to and being turned off not to input, to an inverting input terminal of the operational amplifier, an electric current inputted to the analog-digital conversion circuit, and (iii) a connection selection section that selects a state of connection between the operational amplifier and the first capacitor; a reference voltage is applied to a non-inverting input terminal of the operational amplifier; the connection selection section is capable of selecting between a first state of connection in which the inverting input terminal and an output terminal of the operational amplifier are connected to first and second terminals of the first capacitor, respectively, and a second state of connection in which the inverting input terminal and output terminal of the operational amplifier are connected to the second and first terminals of the first capacitor, respectively; the charge and discharge control section controls the first switch to be on during the first and second periods and controls the first switch to be off during the analog-digital conversion period; and the charge and discharge control section controls the connection selection section to select the first state of connection during the first period and to select the second state of connection during the second period.

According to the foregoing configuration, the selection of the first state of connection by the connection selection section causes the electric charge corresponding to the input current to be put into the first capacitor, and the selection of the second state of connection by the connection selection section causes the electric charge corresponding to the input current to be discharged from the first capacitor.

Furthermore, the analog-digital conversion circuit according to an aspect of the present invention may be configured such that: the digital conversion section includes (i) a comparator that compares a voltage at the second terminal of the first capacitor with the reference voltage, (ii) a discharge circuit that causes the first capacitor to discharge at a predetermined speed while the comparator determines that the voltage at the second terminal of the first capacitor is higher than the reference voltage, and (iii) a counting circuit that counts the number of clocks during a period from a point in time where the comparator determined that the voltage at the second terminal of the first capacitor is higher than the reference voltage and a point in time where the comparator determines that the voltage at the second terminal of the first capacitor is lower than the reference voltage; the charge and discharge control section further includes a second switch that changes between being turned on to connect and being turned off to disconnect the comparator to or from the second terminal of the first capacitor; and the charge and discharge control section controls the second switch to be off during the first and second periods and controls the second switch to be on during the analog-digital conversion period.

According to the foregoing configuration, the number of clocks that are counted by the counting circuit is proportional to the voltage at the second terminal of the first capacitor. Therefore, the digital conversion section can convert the electric charge stored in the first capacitor into a digital signal corresponding to the amount of electric charge.

Furthermore, the analog-digital conversion circuit according to an aspect of the present invention may be configured such that: the charge and discharge control section includes (i) an operational amplifier, (ii) a first switch that changes between being turned on to and being turned off not to input, to an inverting input terminal of the operational amplifier, an electric current inputted to the analog-digital conversion circuit, and (iii) a connection selection section that selects a state of connection between the operational amplifier and the first capacitor; a reference voltage is applied to a non-inverting input terminal of the operational amplifier; the connection selection section is capable of selecting between a first state of connection in which the inverting input terminal and an output terminal of the operational amplifier are connected to first and second terminals of the first capacitor, respectively, and a second state of connection in which the inverting input terminal and output terminal of the operational amplifier are connected to the second and first terminals of the first capacitor, respectively; the charge and discharge control section controls the first switch to be on during the first and second periods and controls the first switch to be off during the analog-digital conversion period; the charge and discharge control section controls the first and second capacitors to be disconnected from each other during the first period, the second period, and the analog-digital conversion period and controls the first and second capacitors to be connected to each other during the charge-transfer period; and the charge and discharge control section controls the connection selection section to select the first state of connection during the first period and to select the second state of connection during the second period.

According to the foregoing configuration, the selection of the first state of connection by the connection selection section causes the electric charge corresponding to the input current to be put into the first capacitor, and the selection of the second state of connection by the connection selection section causes the electric charge corresponding to the input current to be discharged from the first capacitor.

Furthermore, the analog-digital conversion circuit according to an aspect of the present invention may be configured such that the digital conversion section includes (i) a comparator that compares a voltage at the second terminal of the second capacitor with the reference voltage, (ii) a discharge circuit that causes the second capacitor to discharge at a predetermined speed while the comparator determines that the voltage at the second terminal of the second capacitor is higher than the reference voltage, and (iii) a counting circuit that counts the number of clocks during a period from a point in time where the comparator determined that the voltage at the second terminal of the second capacitor is higher than the reference voltage and a point in time where the comparator determines that the voltage at the second terminal of the second capacitor is lower than the reference voltage.

According to the foregoing configuration, the number of clocks that are counted by the counting circuit is proportional to the voltage at the second terminal of the second capacitor. Therefore, the digital conversion section can convert the electric charge stored in the second capacitor into a digital signal corresponding to the amount of electric charge.

Furthermore, the analog-digital conversion circuit according to an aspect of the present invention may be configured such that the charge and discharge control section connects both the inverting input terminal and output terminal of the operational amplifier to the first terminal of the first capacitor prior to the first period.

According to the foregoing configuration, an electric charge corresponding to an offset voltage of the operational amplifier is put into the first capacitor prior to the first period. Therefore, even in a case where an offset voltage is generated at the operational amplifier during the analog-digital conversion period, the digital conversion section can accurately convert the difference between the electric charge corresponding to the electric current inputted during the first period and the electric charge corresponding to the electric current inputted during the second period into a digital value.

Furthermore, the analog-digital conversion circuit according to an aspect of the present invention may be configured such that the charge and discharge control section controls the second switch to be on prior to the first period so that an inverting input terminal and output terminal of the comparator get short-circuited.

According to the foregoing configuration, an electric charge corresponding to an offset voltage of the comparator is discharged from the first capacitor prior to the first period. Therefore, even in a case where an offset voltage is generated at the comparator during the analog-digital conversion period, the digital conversion section can accurately convert the difference between the electric charge corresponding to the electric current inputted during the first period and the electric charge corresponding to the electric current inputted during the second period into a digital value.

Furthermore, the analog-digital conversion circuit according to an aspect of the present invention may be configured such that the charge and discharge control section connects both the inverting input terminal and output terminal of the operational amplifier to the first terminal of the first capacitor and the first terminal of the second capacitor prior to the first period.

According to the foregoing configuration, an electric charge corresponding to an offset voltage of the operational amplifier is put into the first and second capacitors prior to the first period. Therefore, even in a case where an offset voltage is generated at the operational amplifier during the analog-digital conversion period, the digital conversion section can accurately convert the difference between the electric charge corresponding to the electric current inputted during the first period and the electric charge corresponding to the electric current inputted during the second period into a digital value.

Furthermore, the analog-digital conversion circuit according to an aspect of the present invention may be configured such that an inverting input terminal and output terminal of the comparator get short-circuited prior to the first period.

According to the foregoing configuration, an electric charge corresponding to an offset voltage of the comparator is discharged from the second capacitor prior to the first period. Therefore, even in a case where an offset voltage is generated at the comparator during the analog-digital conversion period, the digital conversion section can accurately convert the difference between the electric charge corresponding to the electric current inputted during the first period and the electric charge corresponding to the electric current inputted during the second period into a digital value.

Furthermore, a sensor device according to an aspect of the present invention is a sensor device including: a light source (LED 2) that emits light toward an outside; a light source drive section (LED drive circuit 3) that drives the light source; a photodiode that, in response to light from the outside, generates an electric current corresponding to the intensity of the light; an analog-digital conversion circuit that converts the electric current into a digital signal; and a signal processing section (determination section 4) that processes the digital signal, the analog-digital conversion circuit being an analog-digital conversion circuit according to an aspect of the present invention, the light source drive section driving the light source during the first period and stops driving the light source during the second period.

According to the foregoing configuration, in a case where an object is proximate to the sensor device, the intensity of light that is received by the photodiode during the first period is higher than the intensity of light that is received by the photodiode during the second period by the intensity of light that is emitted from the light source and reflected from the object. Therefore, a digital signal that is outputted from the analog-digital conversion circuit corresponds to the intensity of light that is emitted from the light source and reflected from the object. This allows the signal processing section to detect, for example, whether or not the object is proximate on the basis of the digital signal.

Further, since the analog-digital conversion circuit is an analog-digital conversion circuit according to an aspect of the present invention, a sensor device can be achieved which has high detection accuracy with a simple configuration even under conditions intense disturbance light is incident.

Furthermore, the sensor device according to an aspect of the present invention is configured such that the signal processing section compares the digital signal with a predetermined threshold value and determines, on the basis of a result of the comparison, whether or not an object is proximate to the sensor device at a predetermined distance or shorter.

The foregoing configuration makes it possible to use the sensor device as a proximity sensor.

Furthermore, the sensor device according to an aspect of the present invention is configured such that the signal processing section compares the digital signal with a predetermined threshold value and determines a distance of an object to the sensor device on the basis of a result of the comparison.

The foregoing configuration makes it possible to use the sensor device as a range sensor.

Furthermore, the sensor device according to an aspect of the present invention is configured such that the photodiode comprises a plurality of photodiodes; the analog-digital conversion circuit comprises a plurality of analog-digital conversion circuits; each of the analog-digital conversion circuits converts an electric current generated by a corresponding one of the photodiodes into a digital signal; and the signal processing section determines a state of movement of an object with respect to the sensor device on the basis of a digital signal outputted from each of the photodiodes.

The foregoing configuration makes it possible to use the sensor device as a motion sensor.

Furthermore, a cellular phone according to an aspect of the present invention includes a sensor device according to an aspect of the present invention, and a digital camera according to an aspect of the present invention includes a sensor device according to an aspect of the present invention.

The present invention is not limited to the description of the embodiments above, but may be altered by a skilled person within the scope of the claims. An embodiment based on a proper combination of technical means disclosed in different embodiments is encompassed in the technical scope of the present invention.

Industrial Applicability

An analog-digital conversion circuit according to the present invention can be used as a sensor device such as a proximity sensor, a range sensor, or a motion sensor. Further, a sensor device according to the present invention can be mounted on any of various types of electronic device such as a cellular phone and a digital camera.

Reference Signs List

1 Proximity sensor (sensor device)
1a Proximity sensor (sensor device)
1b Proximity sensor (sensor device)
2 LED (light source)
3 LED drive circuit (light source drive section)
4 Determination section (signal processing section)
5 Digital conversion section
5a Digital conversion section
5b Digital conversion section
6 Charge and discharge control section
6a Charge and discharge control section
6b Charge and discharge control section
7 Switch control circuit
7b Switch control circuit
8 Reference voltage source
10 Detected object
11 Motion sensor (sensor device)
14 Determination section (signal processing section)
40 Detected object
51 Comparison circuit
52 Counting circuit
53 Discharge circuit
54 Transfer circuit (transfer section)
61 Connection selection circuit (connection selection section)
ADC1 to ADC4 Analog-digital conversion circuit
ADCOUT1 to ADCOUT4 Digital value (digital signal)
AMP1 Operational amplifier
C1 Capacitor (first capacitor)
C2 Capacitor (second capacitor)
CMP1 Comparator
COUNT1 Counter
Data_th Threshold value
FF1 Flip-flop
I1 Reference current
Iin1 Electric current (input current that flows during first period)
Iin2 Electric current (input current that flows during second period)
PD1 to PD4 Photodiode
SW1 Switch (first switch)
SW2 Switch (second switch)
SW3 to SW14 Switch
T1 Terminal (first terminal of first capacitor)
T2 Terminal (second terminal of first capacitor)
T3 Terminal (first terminal of second capacitor)
T4 Terminal (second terminal of second capacitor)
V1 Reference voltage
t1 Period (first period)
t2 Period (second period)
t11 Period (first period of first charge and discharge cycle)
t12 Period (second period of first charge and discharge cycle)
t21 Period (first period of second charge and discharge cycle)
t22 Period (second period of second charge and discharge cycle)

The invention claimed is:

1. An analog-digital conversion circuit comprising:
a first capacitor;
a digital conversion section that converts an amount of electric charge stored in the first capacitor into a digital signal; and
a charge and discharge control section that controls charge and discharge of the first capacitor,
the charge and discharge control section putting, into the first capacitor, an electric charge corresponding to an electric current inputted to the analog-digital conversion circuit during a first period,
the charge and discharge control section causing an electric charge corresponding to an electric current inputted to the analog-digital conversion circuit during a second period that follows the first period to be discharged from the first capacitor, the charge and discharge control section performs more than once a charge and discharge cycle including (i) charging the first capacitor during the first period and (ii) discharging the first capacitor during the second period, during an analog-digital conversion period that comes after the end of the charge and discharge control carried out by the charge and discharge control section, the digital conversion section converting an amount of electric charge stored in the first capacitor at the end of the charge and discharge control into a digital signal.

2. The analog-digital conversion circuit as set forth in claim 1, wherein:

the digital conversion section includes
(i) a second capacitor having a capacitance that is lower than the capacitance of the first capacitor and
(ii) a transfer section that transfers the electric charge stored in the first capacitor to the second capacitor during a charge-transfer period that comes after the end of the charge and discharge control carried out by the charge and discharge control section and that comes before the start of the analog-digital conversion period; and the digital conversion section converts an amount of electric charge stored in the second capacitor at the end of the transfer of the electric charge by the transfer section into a digital signal.

3. The analog-digital conversion circuit as set forth in claim 1, wherein:

the charge and discharge control section includes
(i) an operational amplifier,
(ii) a first switch that changes between being turned on to and being turned off not to input, to an inverting input terminal of the operational amplifier, an electric current inputted to the analog-digital conversion circuit, and
(iii) a connection selection section that selects a state of connection between the operational amplifier and the first capacitor;

a reference voltage is applied to a non-inverting input terminal of the operational amplifier;

the connection selection section is capable of selecting between a first state of connection in which the inverting input terminal and an output terminal of the operational amplifier are connected to first and second terminals of the first capacitor, respectively, and a second state of connection in which the inverting input terminal and output terminal of the operational amplifier are connected to the second and first terminals of the first capacitor, respectively;

the charge and discharge control section controls the first switch to be on during the first and second periods and controls the first switch to be off during the analog-digital conversion period; and the charge and discharge control section controls the connection selection section to select the first state of connection during the first period and to select the second state of connection during the second period.

4. The analog-digital conversion circuit as set forth in claim 3, wherein:

the digital conversion section includes
(i) a comparator that compares a voltage at the second terminal of the first capacitor with the reference voltage,
(ii) a discharge circuit that causes the first capacitor to discharge at a predetermined speed while the comparator determines that the voltage at the second terminal of the first capacitor is higher than the reference voltage, and
(iii) a counting circuit that counts the number of clocks during a period from a point in time where the comparator determined that the voltage at the second terminal of the first capacitor is higher than the reference voltage and a point in time where the comparator determines that the voltage at the second terminal of the first capacitor is lower than the reference voltage;

the charge and discharge control section further includes a second switch that changes between being turned on to connect and being turned off to disconnect the comparator to or from the second terminal of the first capacitor; and the charge and discharge control section controls the second switch to be off during the first and second periods and controls the second switch to be on during the analog-digital conversion period.

5. The analog-digital conversion circuit as set forth in claim 2, wherein:

the charge and discharge control section includes
(i) an operational amplifier,
(ii) a first switch that changes between being turned on to and being turned off not to input, to an inverting input terminal of the operational amplifier, an electric current inputted to the analog-digital conversion circuit, and
(iii) a connection selection section that selects a state of connection between the operational amplifier and the first capacitor;

a reference voltage is applied to a non-inverting input terminal of the operational amplifier;

the connection selection section is capable of selecting between a first state of connection in which the inverting input terminal and an output terminal of the operational amplifier are connected to first and second terminals of the first capacitor, respectively, and a second state of connection in which the inverting input terminal and output terminal of the operational amplifier are connected to the second and first terminals of the first capacitor, respectively;

the charge and discharge control section controls the first switch to be on during the first and second periods and controls the first switch to be off during the analog-digital conversion period;

the charge and discharge control section controls the first and second capacitors to be disconnected from each other during the first period, the second period, and the analog-digital conversion period and controls the first and second capacitors to be connected to each other during the charge-transfer period; and the charge and discharge control section controls the connection selection section to select the first state of connection during the first period and to select the second state of connection during the second period.

6. The analog-digital conversion circuit as set forth in claim 5, wherein the digital conversion section includes
(i) a comparator that compares a voltage at the second terminal of the second capacitor with the reference voltage,
(ii) a discharge circuit that causes the second capacitor to discharge at a predetermined speed while the comparator determines that the voltage at the second terminal of the second capacitor is higher than the reference voltage, and
(iii) a counting circuit that counts the number of clocks during a period from a point in time where the comparator determined that the voltage at the second terminal of the second capacitor is higher than the reference voltage and a point in time where the comparator determines that the voltage at the second terminal of the second capacitor is lower than the reference voltage.

7. The analog-digital conversion circuit as set forth in claim 4, wherein the charge and discharge control section connects both the inverting input terminal and output terminal of the operational amplifier to the first terminal of the first capacitor prior to the first period.

8. The analog-digital conversion circuit as set forth in claim 4, wherein the charge and discharge control section controls the second switch to be on prior to the first period so that an inverting input terminal and output terminal of the comparator get short-circuited.

9. The analog-digital conversion circuit as set forth in claim 6, wherein the charge and discharge control section connects both the inverting input terminal and output terminal of the operational amplifier to the first terminal of the first capacitor and the first terminal of the second capacitor prior to the first period.

10. The analog-digital conversion circuit as set forth in claim 6, wherein an inverting input terminal and output terminal of the comparator get short-circuited prior to the first period.

11. A sensor device comprising:
a light source that emits light toward an outside;
a light source drive section that drives the light source;
a photodiode that, in response to light from the outside, generates an electric current corresponding to the intensity of the light;
an analog-digital conversion circuit that converts the electric current into a digital signal; and
a signal processing section that processes the digital signal,
the analog-digital conversion circuit being an analog-digital conversion circuit as set forth in claim 1,
the light source drive section driving the light source during the first period and stops driving the light source during the second period.

12. The sensor device as set forth in claim 11, wherein the signal processing section compares the digital signal with a predetermined threshold value and determines, on the basis of a result of the comparison, whether or not an object is proximate to the sensor device at a predetermined distance or shorter.

13. The sensor device as set forth in claim 11, wherein the signal processing section compares the digital signal with a predetermined threshold value and determines a distance of an object to the sensor device on the basis of a result of the comparison.

14. The sensor device as set forth in claim 11, wherein:
the photodiode comprises a plurality of photodiodes;
the analog-digital conversion circuit comprises a plurality of analog-digital conversion circuits;
each of the analog-digital conversion circuits converts an electric current generated by a corresponding one of the photodiodes into a digital signal; and
the signal processing section determines a state of movement of an object with respect to the sensor device on the basis of a digital signal outputted from each of the photodiodes.

15. A cellular phone comprising a sensor device as set forth in claim 11.

16. A digital camera comprising a sensor device as set forth in claim 11.

* * * * *